United States Patent [19]

Fujishima et al.

[11] Patent Number: 5,226,139
[45] Date of Patent: Jul. 6, 1993

[54] SEMICONDUCTOR MEMORY DEVICE WITH A BUILT-IN CACHE MEMORY AND OPERATING METHOD THEREOF

[75] Inventors: Kazuyasu Fujishima; Yoshio Matsuda; Hideto Hidaka; Mikio Asakura, all of Itami, Japan

[73] Assignee: Mitsubishi Denki Kabushiki Kaisha, Tokyo, Japan

[21] Appl. No.: 637,872

[22] Filed: Jan. 8, 1991

[30] Foreign Application Priority Data

Jan. 16, 1990 [JP] Japan .................................. 2-7598

[51] Int. Cl.⁵ .............................................. G06F 12/00
[52] U.S. Cl. ........................... 395/425; 364/DIG. 1; 364/243.41; 364/244.2; 364/254.3; 395/400; 365/189.05; 365/230.03
[58] Field of Search .................. 395/425, 400; 364/200 MS File, 900 MS File

[56] References Cited

U.S. PATENT DOCUMENTS

| | | |
|---|---|---|
| 4,330,852 | 5/1982 | Redwine et al. .................. 365/221 |
| 4,577,293 | 3/1986 | Matick et al. .................... 364/200 |
| 4,725,945 | 2/1988 | Kronstadt et al. ................. 364/200 |
| 4,870,622 | 9/1989 | Aria et al. ........................ 364/200 |
| 4,926,385 | 5/1990 | Fujishima et al. ............. 365/230.03 |
| 5,111,386 | 5/1992 | Fujishima et al. ................. 395/425 |
| 5,150,327 | 9/1992 | Matsushima et al. .......... 365/189.01 |

Primary Examiner—Joseph L. Dixon
Assistant Examiner—Frank J. Asta
Attorney, Agent, or Firm—Lowe, Price, LeBlanc & Becker

[57] ABSTRACT

A semiconductor memory device with a built-in cache memory comprises a memory cell array (1). The memory cell array (1) is divided into a plurality of blocks (B1 to B16). Each block is divided into a plurality of sub blocks each having a plurality of columns. At the time of a cache hit, block address signals (B0, B1) and a column address signal (CA) are simultaneously applied. Any of the plurality of blocks (B1 to B16) is selected in response to the block address signals (B0, B1). At the same time, any of the plurality of registers (16a) corresponding to the selected block is selected in response to the column address signal (CA). The data stored in the register (16a) is thereby read out at a high speed 22 Claims, 16 Drawing Sheets

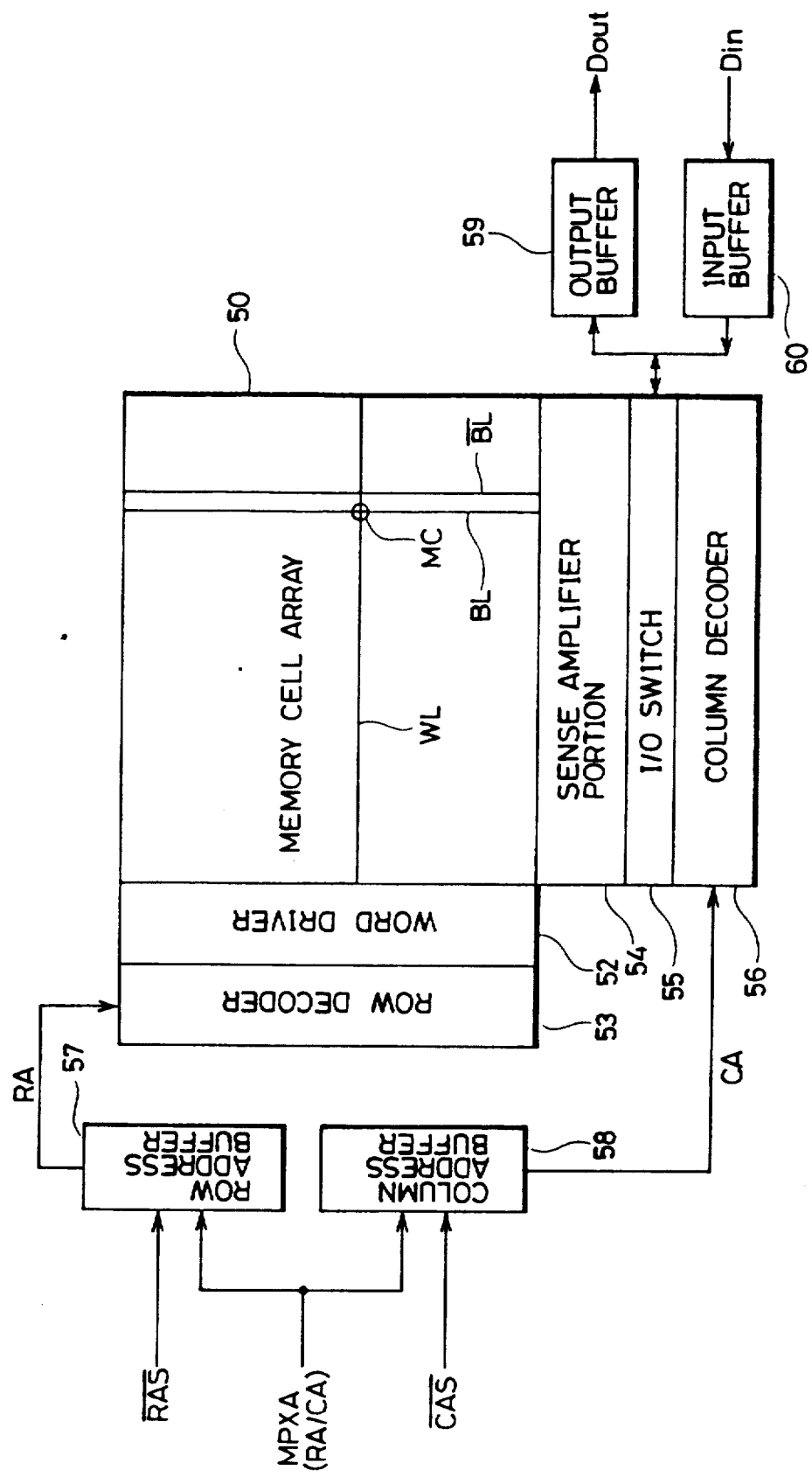

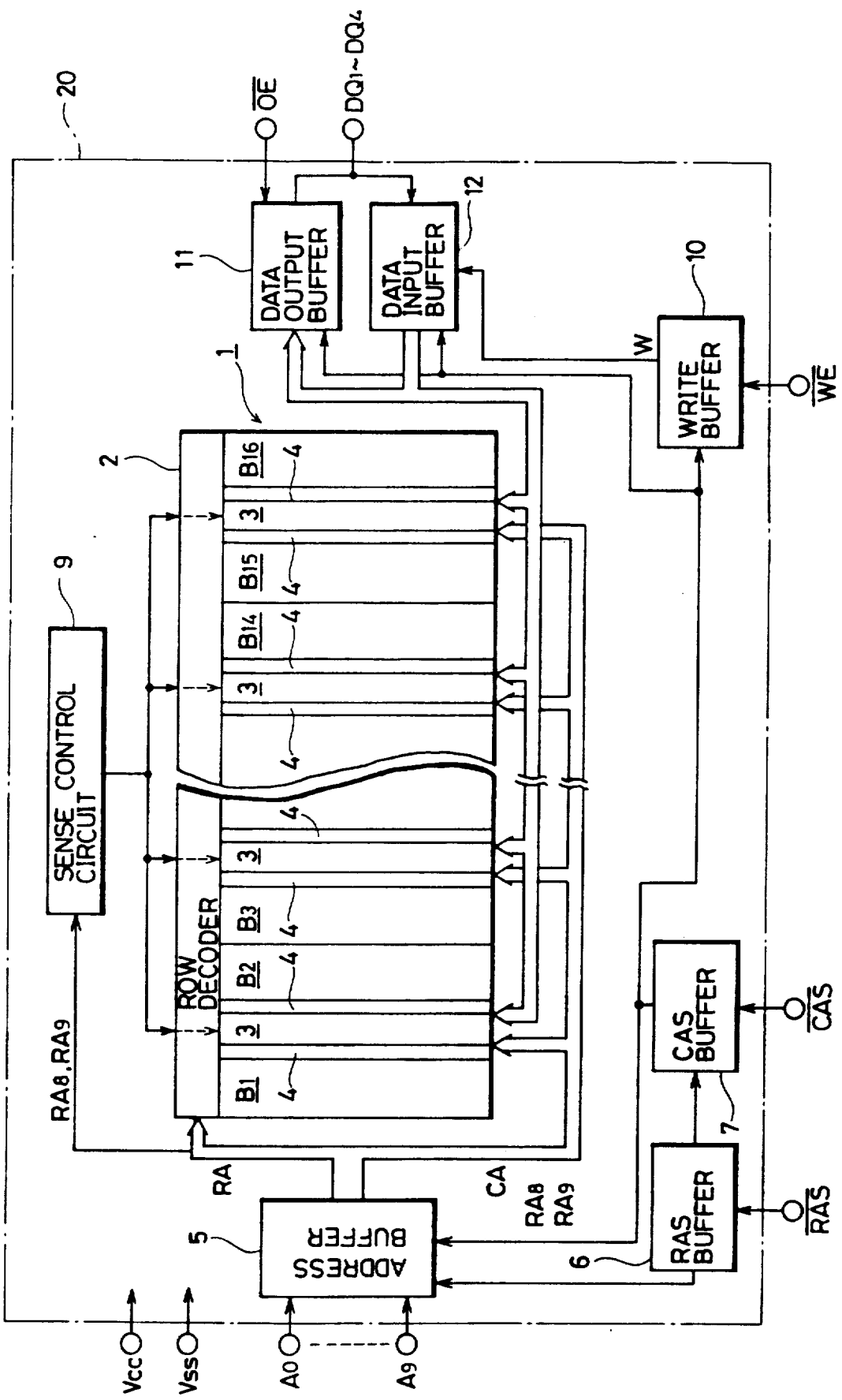

SEMICONDUCTOR MEMORY DEVICE WITH A BUILT-IN CACHE MEMORY AND OPERATING METHOD THEREOF

CROSS-REFERENCE TO RELATED APPLICATIONS

This application is related to copending applications Ser. Nos. 228,589 filed Aug. 5, 1988, 248,712 filed Sep. 26, 1988, 254,233 filed Oct. 6, 1988, 266,060 filed Nov. 2, 1988, 266,601 filed Nov. 3, 1988 commonly assigned with the present invention.

BACKGROUND OF THE INVENTION

1. Filed of the Invention

The invention relates generally to semiconductor memory devices, and, more particularly, semiconductor memory devices with cache memories integrated on the same chip.

2. Description of the Background Art

A main memory contained in a computer system comprises a dynamic random access memory (hereinafter referred to as DRAM) of low speed and large capacity, therefore of low cost. In order to improve the cost performance of a computer system, a high speed memory of small capacity is often provided as a high speed buffer between a main memory and a central processing unit (hereinafter referred to as CPU). This high speed buffer is referred to as cache memory. In this cache memory, the blocks of data which CPU is most likely to require is copied and stored from the main memory. In the DRAM, the state in which the data stored in the address, which the CPU was to access to, also exists in the cache memory is called a "cache hit". In this case the CPU accesses a high speed cache memory, and reads out the required data from the cache memory. In the DRAM, the state in which the data stored in the address, which the CPU was to access to, does not exist in the cache memory is called a "cache miss". In this case, the CPU accesses a low speed main memory, and transfers the block, which the data belongs to, from the DRAM to the cache memory at the same time when it reads out the required data from the main memory.

However, such a cache memory system requires an expensive high speed memory, so that it can not be used in a small size computer system in which cost is valued highly. Therefore, conventionally, a simplified cash system was constituted, utilizing a page mode or a static column mode contained in a general purpose DRAM.

FIG. 10 is a block diagram showing a fundamental configuration of a conventional DRAM device capable of operating in a page mode or in a static column mode.

In FIG. 10, in a memory cell array 50, a plurality of word lines and a plurality of bit line pairs are arranged to intersect each other with a memory cell provided at each of their intersections. In FIG. 10, one word line WL, one bit line pair BL, $\overline{BL}$, and one memory cell MC provided at the intersection of the word line WL and the bit line BL are only representatively shown.

The word line in the memory cell array 50 is connected to a row decoder 53 through a word driver 52. The bit line pair in the memory cell array is connected to a column decoder 56 through a sense amplifier portion 54 and an I/O switch 55. A row address buffer 57 and a column address buffer 58 are provided with multiplexed signals MPXA which are a row address signal RA and a column address signal CA multiplexed. The row address buffer 57 supplies the row address signal RA to the row decoder 53, and the column address buffer 53 supplies the column address signal CA to the column decoder 56. An output buffer 59 and an input buffer 60 are connected to the I/O switch 55.

FIGS. 11A, 11B and 11C respectively show operation waveform diagrams of a normal read cycle, a page mode cycle and a static column mode cycle of the DRAM device.

In the normal read cycle shown in FIG. 11A, the row address buffer 57 initially accepts the multiplexed address signal MPXA at the fall edge of a row address strove signal $\overline{RAS}$, and supplies the same as a row address signal RA to the row decoder 53. The row decoder 53 selects one of a plurality of word lines in response to the row address signal RA. The selected word line is activated by the word driver 52. As a result, information stored in the plurality of memory cells connected to the word line is each read out on a corresponding bit line, and the information is detected and amplified by the sense amplifier portion 54. At this time, a row of information of the memory cell is latched in the sense amplifier portion 54.

Subsequently, the column address buffer 58 accepts a multiplexed address signal MPXA at the fall edge of a column address strobe signal $\overline{CAS}$, and supplies the same as a column address signal CA to the column decoder 56. The column decoder 56 selects one bit out of one row of information latched in the sense amplifier portion 54 in response to the column address signal CA. This selected information is supplied to the outside as an output data Dout through the I/O switch 55 and the output buffer 59.

In this case, the access time (RAS access time) $t_{RAC}$ corresponds to the time period from the fall edge of the row address strobe signal $\overline{RAS}$ to the time when the output data Dout becomes valid. In this case, the cycle time $t_c$ is the sum of the time during which the device is in an active state and the RAS precharge time $t_{RP}$. As a standard value, in the case in which $t_{RAC}=100$ ns, $t_c$ is about 200 ns.

In the page mode cycle and the static column mode cycle shown in FIGS. 11B and 11C, a memory cell on the same row may be accessed by changing the column address signal CA. In the page mode cycle, the column address signal CA is latched at the fall edge of the column address strobe signal $\overline{CAS}$. In the static column mode cycle, an access is made only by the change of the column address signal CA as in the static RAM (SRAM).

The CAS access time $t_{CAC}$ of the page mode cycle and the address access time $t_{AA}$ of the static column mode cycle attain a value of about ½ of the RAS access time $t_{RAC}$, and when $t_{RAC}=100$ ns, they are about 50 ns. In this case, the cycle time, which depends on the CAS precharge time $t_{CP}$ with regards to the page mode cycle, is shortened to be a value of about 50 ns, which is similar to the static column mode cycle.

FIG. 12 is a diagram showing a fundamental configuration of a 4M bit DRAM device of a conventional 1M ×4 bits structure capable of operating in a page mode or in a static column mode.

In FIG. 12, the DRAM device 20 is formed on one chip. A memory cell array 1 is divided into 16 array blocks B1 to B16. As shown in FIG. 13, a sub memory cell array 101 comprises blocks B1, B5, B9, B13, and corresponds to an input and output data DQ1. Similarly, a sub memory cell array 102 corresponds to an input and output data DQ2, a sub memory cell array 103 corresponds to an input and output data DQ3, and a sub memory cell array 104 corresponds to an input and output data DQ4.

The address buffer 5 accepts externally applied address signals A0 to A9 at the fall edge of the row address strobe signal $\overline{RAS}$ supplied from an RAS buffer 6, and supplies the same as a row address signal RA to a row decoder 2. The row address signal RA comprises row address signals RA0 to RA9 of 10 bits. The address buffer accepts externally applied address signals A0 to A9 at the fall edge of the column address strobe signal $\overline{CAS}$ supplied from a CAS buffer 7, and supplies it as a column address signal CA to a column decoder 3. The column address signal CA comprises column address signals CA0 to CA9 of 10 bits. A sense control circuit 9 is responsive to row address signals RA8, RA9 of 2 bits among the row address signals RA to cause a sense amplifier portion 4 corresponding to four of the 16 array blocks B1 to B16 to operate.

A data output buffer 11 is responsive to an externally applied output enable signal $\overline{OE}$ to supply the information of 4 bits read out from the memory cell array 1 as output data DQ1 to DQ4 to the outside. A write buffer 10 is responsive to an externally applied write enable signal $\overline{WE}$ to supply a write signal W to a data input buffer 12. The data input buffer 12 is responsive to the write signal W to supply externally applied input data DQ1 to DQ4 of 4 bits to the memory cell array 1.

FIG. 14 is a block diagram fully showing the configuration of the sub memory cell array 101 corresponding to the input and output data DQ1. As shown in FIG. 14, the sub memory cell array 101 of 1M bits corresponding to one input and output bit is divided into four array blocks B1, B5, B9, B13 of $1K \times 256$ bits respectively. Each array block is provided with a sense amplifier group 14 comprising a plurality of sense amplifiers, an I/O switch 17 and a column decoder 19. One of four array blocks B1, B5, B9, B13 is selectively driven in response to 2 bit row address signals RA8, RA9. In the configuration shown in FIG. 14, the number of sense amplifiers is increased, and the length of each bit line is shortened. As a result, the read voltage which is read out from the memory cell to the sense amplifier may be increased. In addition, by means of a dividing operation, it becomes possible to reduce power consumption.

In the array block selected by the row address signals RA8, RA9, one word line (not shown) is selected by the row decoder 2. The information stored in a plurality of memory cells (not shown) connected to the word line is supplied to the each corresponding sense amplifier through the each corresponding bit line (not shown). The information is sensed and amplified by the sense amplifiers.

In the example of FIG. 14, the sense amplifier group 14 corresponding to each array block comprises 1K (1024) sense amplifiers. In this case, one of four sense amplifier groups 14 provided corresponding to four array blocks B1, B5, B9, B13 is selectively driven in response to the row address signals RA8, RA9 of 2 bits. When the sense amplifier is activated, a row ($1K \times 4$ bits) of information is latched in the four sense amplifier groups 14. Accordingly, the page mode and the static column mode shown in FIGS. 11B and 11C are made possible by selecting a sense amplifier through the column decoder 19 by way of the column address signal CA.

FIG. 15 is a block diagram showing a configuration of a simplified cache system utilizing a page mode or a static column mode of the DRAM devices in FIGS. 12 to 14. FIG. 16 is a operation waveform diagram of the simplified cache system of FIG. 15.

In FIG. 15, a main memory 21 is formed to have capacity of 4M bytes by 8 DRAM devices 20 of $1M \times 4$ bit structure. In this case, 20 ($2^{20} = 1048576 = 1M$) address lines are required before a row address signal and a column address signal are multiplexed. However, the row address signal RA and the column address signal CA are multiplexed by an address multiplexer 22, so that 10 address lines are in fact connected to each DRAM device 20.

The operation of the simplified cache system of FIG. 15 will now be described with reference to the operation waveform diagram of FIG. 16.

An address generator 23 generates an address signal AD of 20 bits corresponding to the data required by a CPU 24. A latch (tag) 25 holds the row address signal corresponding to the data selected in the previous cycle. A comparator 26 compares the 10 bit row address signal RA among 20 bit address signals AD with the row address signal held in the latch 25. If those coincide with each other, it means the same row as that in the previous cycle has been accessed in the present cycle. This is called a "cache hit". In this case the comparator 26 generates a cache hit signal CH.

A state machine 27 is responsive to the cache hit signal CH to perform a page mode control in which the column address strobe signal $\overline{CAS}$ is toggled while maintaining the row address strobe signal $\overline{RAS}$ at a low level. At this time, the address multiplexer 22 applies a column address signal CA to each DRAM device 20 (see FIG. 16). As a result, data corresponding to the column address signal CA is outputted by way of the data group latched in the sense amplifier portion of each DRAM device 20. Thus, at the time of a cache hit, an output data, at a high speed, may be obtained from each DRAM device 20 at the access time $t_{CAC}$.

If the row address signal RA generated from the address generator 23 and the row address signal held in the latch 25 do not coincide with each other, it means a row different from that of the previous cycle has been accessed in the present cycle. This is called a "cache miss".

In this case, the comparator 25 does not generate a cache hit signal CH. The state machine 27 performs an RAS/CAS control of the normal read cycle, and the address multiplexer 22 in turn applies the row address signal RA and the column address signal CA to each DRAM device 20 (see FIG. 16). Thus, at the time of a cache miss, a normal read cycle, which starts with a precharge by the row address strobe signal $\overline{RAS}$, is initiated, and an output data, at a low speed, is obtained at the access time $t_{RAC}$. Therefore, the state machine 27 generates a wait signal Wait to set the CPU 24 in a stand-by state. At the time of a cache miss, a new row address signal RA is held in the latch 25.

In the simplified cache system of FIG. 15, the data of one row of each array block in each DRAM device 20 (1024 bits in the case of $1M \times 4$ bit DRAM device) is latched as one data block in the sense amplifier group. Accordingly, the size of one data block is unnecessarily large, so that the data blocks (the number of entries) held in the latch (tag) 25 become insufficient. For example, in the simplified cache system of FIG. 15, the number of entries is 1. Accordingly, there is a problem that the rate in which a cache hit occurs (cache hit rate) is low.

SUMMARY OF THE INVENTION

One object of the invention is to obtain a semiconductor memory device with a built-in cache memory having a data block of appropriate size, which is capable of constituting a simplified cache system in which a cache hit rate is improved by the increased number of entries, and the cost performance thereof is high.

Another object of the present invention is to expand the operational margin of the semiconductor memory device with a built-in cache memory to implement a simplified cache system in which power consumption is reduced.

The semiconductor memory device with a built-in cache memory in accordance with a first aspect of the present invention is directed to a semiconductor memory device with a built-in cache memory capable of a first operation mode in which a normal access is performed and a second operation mode in which a high speed access is performed, and comprises a memory cell array, a signal receiving circuit, a first selecting circuit, a second selecting circuit, a plurality of sense amplifier circuits, and a third selecting circuit.

The memory cell array comprises a plurality of memory cells arranged in a plurality of rows and a plurality of columns, and is divided into a plurality of blocks. The signal receiving circuit receives a row address signal and a column address signal, which are externally applied, in a time-sharing manner or simultaneously at the time of the first operation mode, while simultaneously receiving a block selecting signal and a column address signal, which are externally applied, at the time of the second operation mode. The first selecting circuit is, at the time of the first operation mode, responsive to a part of the row address signals to select any of the plurality of blocks, and at the time of the second operation mode, responsive to the block selecting signal to select any of the plurality of blocks. The second selecting circuit is responsive to the remaining of the row address signals to select any row in the selected block. The plurality of sense amplifier circuits are provided in response to a plurality of columns in each block to amplify and hold the information read out from the selected row. The third selecting circuit is, at the time of the first and the second operation modes, responsive to the column address signal to select any of the plurality of sense amplifier circuits in the selected block. At the time of the second operation mode, the first selecting circuit and the third selecting circuit are controlled to operate simultaneously.

The semiconductor memory device with a built-in cache memory in accordance with a second aspect of the present invention is directed to a semiconductor memory device with a built-in cache memory capable of a first operation mode in which a normal access is performed and a second operation mode in which a high speed access is performed, and comprises a memory cell array, a signal receiving circuit, a first selecting circuit, a second selecting circuit, a plurality of sense amplifier circuits, a plurality of information holding circuits, a third selecting circuit, an information transferring circuit, and a fourth selecting circuit.

The memory cell array comprises a plurality of memory cells arranged in a plurality of rows and a plurality of columns, and is divided into a plurality of blocks. Each block is divided into a plurality of sub blocks each comprising a plurality of columns. At the time of the first operation mode, the signal receiving circuit, in a time-sharing manner or simultaneously, receives a row address signal and a column address signal which are externally applied, and at the time of the second operation mode, it simultaneously receives a block selecting signal and a column address signal which are externally applied. At the time of the first operation mode, the first selecting circuit is responsive to a part of the row address signals to select any of the plurality of blocks while, at the time of the second operation mode, it is responsive to the block selecting signal to select any of the plurality of blocks. The second selecting circuit is responsive to the remaining of the row address signals to select any row in the selected block.

The plurality of sense amplifier circuits are provided in response to a plurality of columns in each block to amplify and hold the information read out of the selected row. The plurality of information holding circuits are provided in response to a plurality of columns in each block to hold information. At the time of the first operation mode, the third selecting circuit is responsive to a part of column address signals to select any of the plurality of sub blocks in the selected block. At the time of the first operation mode, the information transferring circuit transfers information between the row selected by the first selecting circuit and the corresponding information holding circuit in the selected sub block. At the time of the first operation mode, the fourth selecting circuit is responsive to a column address signal to select any of the plurality of sense amplifier circuits in the selected block while, at the time of the second operation mode, it is responsive to a column address signal to select any of the plurality of information holding circuits corresponding to the selected block.

At the time of the second operation mode, the first selecting circuit and the fourth selecting circuit are controlled to operate simultaneously.

In the semiconductor memory device in accordance with the first aspect, at the time of the first operation mode, one block is selected by the first selecting circuit, and one row in the block is selected by the second selecting circuit. The information read out from the selected row is amplified and held by a plurality of sense amplifier circuits corresponding to the block. Any of the information held in the plurality of sense amplifier circuits in the block is selected by the third selecting circuit. As a result, an access is made at a normal access time.

At the time of the second operation mode, one block is selected by the first selecting circuit, and any of the information held in the plurality of sense amplifier circuits corresponding to the block is selected by the third selecting circuit. As a result, an access is made at a shorter access time than a normal access time.

Particularly, in this semiconductor memory device, at the time of the second operation mode, the first selecting circuit and the third selecting circuit operate simultaneously, so that the access time is shortened.

When a cache system is constituted using the semiconductor memory device in accordance with the first aspect, the number of the divided blocks corresponds to the number of entries, and the number of the plurality of sense amplifier circuits corresponding to each block corresponds to the size of each data block.

In the semiconductor memory device in accordance with the second aspect, at the time of the first operation mode, one block is selected by the first selecting circuit, and one row in the block is selected by the second selecting circuit. The information read out from the one selected row is amplified and held by a plurality of sense amplifier circuits corresponding to the block. Any of the information held in the plurality of sense amplifier circuits corresponding to the block is selected by the fourth selecting circuit. Thus, an access is made at a normal access time. One sub block in the block is selected by the third selecting circuit, and information is transferred between the row selected in the sub block and a corresponding information holding circuit by the information transferring circuit.

At the time of the second operation mode, one block is selected by the first selecting circuit, and any of the information held in the plurality of information holding circuits corresponding to the block is selected by the fourth selecting circuit. Thus, an access is made at a shorter access time than a normal access time.

Particularly, in this semiconductor memory device, at the time of the second operation mode, the first selecting circuit and the fourth selecting circuit operate simultaneously, so that access time is shortened.

In the case in which a cache system is constituted using the semiconductor memory device in accordance with the second aspect of the invention, the number of sub blocks corresponds to the number of entries, and the number of the plurality of information holding circuits corresponding to each sub block corresponds to the size of a data block.

As stated above, in accordance with the first aspect of the present invention, the number of the plurality of blocks which perform a partial dividing operation corresponds to the number of entries, and the number of the sense amplifier circuits corresponding to each block corresponds to the size of the data block. According to the second aspect of the present invention, the number of the sub blocks corresponds to the number of entries, and the number of the information holding circuits corresponding to each sub block corresponds to the size of a data block. Therefore, the size of the data blocks becomes appropriate, and the number of entries is increased. Accordingly, the cache hit rate is improved, making it possible to constitute a simplified cache system in which the cost performance is high.

In accordance with the first aspect, at the time of a cache hit, the first selecting circuit and the third selecting circuit operate simultaneously. In accordance with the second aspect, at the time of a cache hit, the first selecting circuit and the fourth selecting circuit operate simultaneously. Therefore, the access time at the time of a cache hit is shortened.

Furthermore, a memory cell array of a dividing operation type is adopted in which the read voltage from the memory cell may be increased, and power consumption may be decreased, so that a simplified cache system may be obtained with a wide operation margin and low power consumption.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 10 is a block diagram showing one example of the configuration of a conventional DRAM device.

FIG. 12 is a block diagram showing the configuration of a conventional DRAM device of 1M×4 bit structure.

DESCRIPTION OF THE PREFERRED EMBODIMENTS

Figure 1:
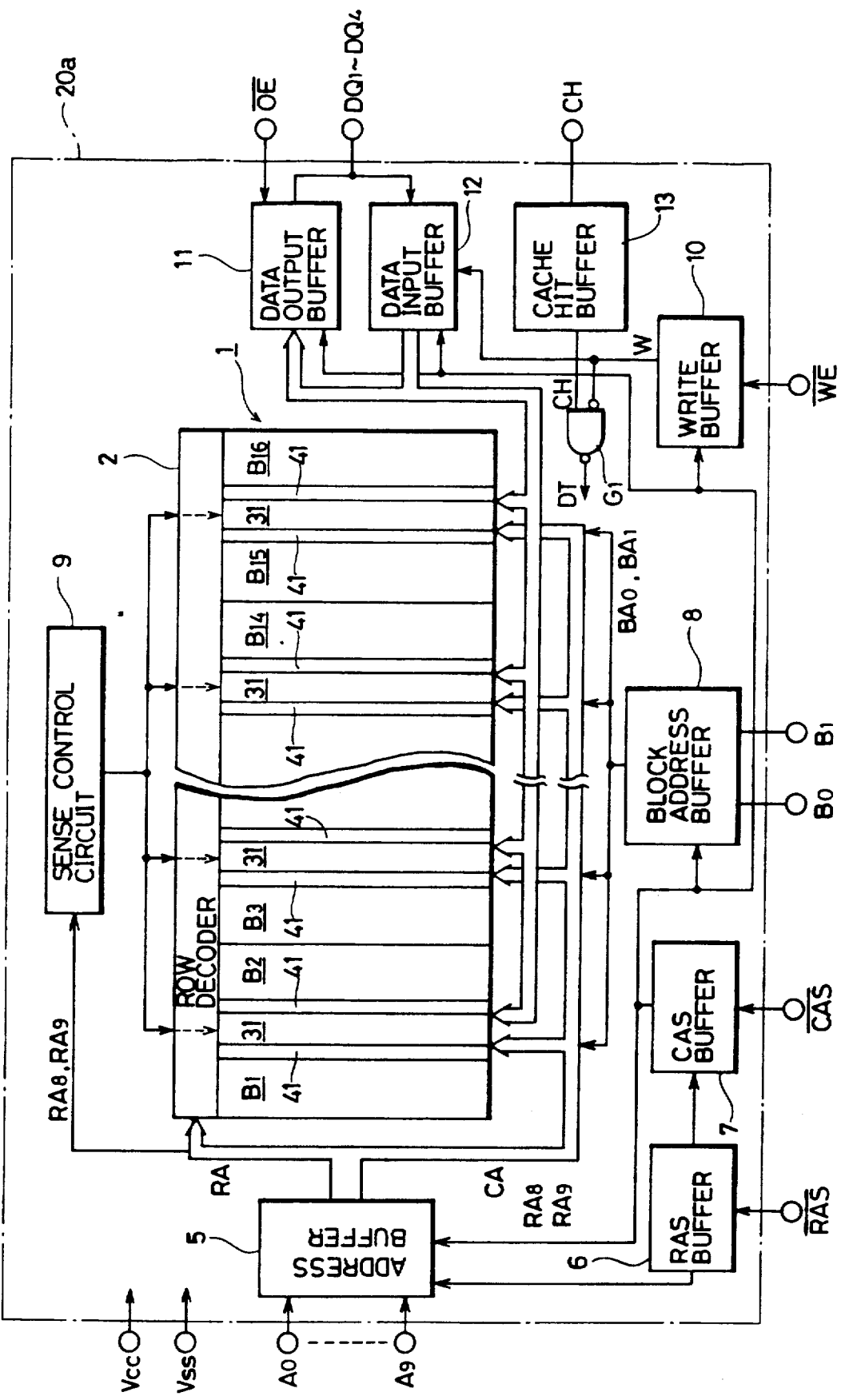
FIG. 1 is a block diagram showing the configuration of a DRAM device in accordance with a first embodiment of the present invention.

FIG. 1 is a block diagram showing the configuration of a DRAM device of 1M×4 bit structure in accordance with one embodiment of the present invention.

Figure 13:
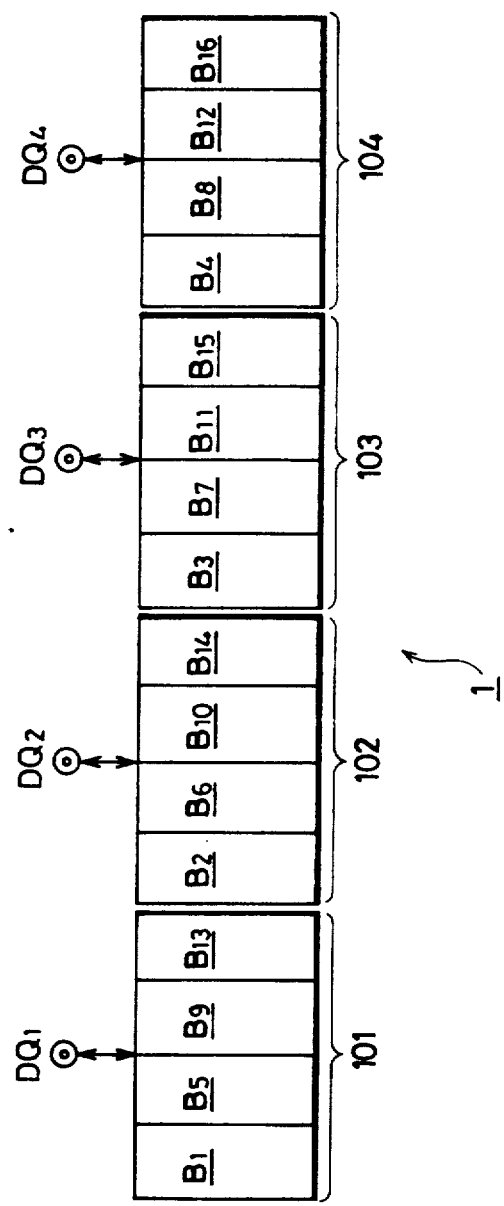
FIG. 13 is a block diagram showing the configuration of the memory cell array of the DRAM device in FIG. 12.

In FIG. 1, a DRAM device 20a, as well as a DRAM device 20 in FIG. 12, comprises a memory cell array 1 of 1M×4 bit structure. The memory cell array 1 is divided into 16 array blocks B1 to B16 of 1K×256 bits. The memory cell array 1, as shown in FIG. 13, comprises 4 sub memory cell arrays 101 to 104 corresponding to 4 bit input and output data DQ1 to DQ4.

The DRAM device 20a in FIG. 1 is different from the DRAM device 20 in FIG. 12 in that: there are provided a block address buffer 8 for receiving externally applied block address signals B0, B1 and a cache hit buffer 13 for receiving an externally applied cache hit signal CH; a gate circuit G1 is provided which outputs a data transferring signal DT in response to the cache hit signal CH supplied from the cache hit buffer 13 and a write signal W supplied from a write buffer 10; and the structures of the regions 31, 41 provided between the array blocks in the memory cell array 1, as will be described later, are different from those of the corresponding portion of the DRAM device 20a in FIG. 12.

In the DRAM device 20a in FIG. 1, an address buffer 5 receives multiplexed address signals A0 to A9, so that, at a normal access time, a row address signal RA and a column address signal CA are provided in a time-sharing manner. The row address signal RA comprises 10 bit row address signals RA0 to RA9, and the column address signal CA comprises 10 bit column address signals CA0 to CA9.

Therefore, the row address signals RA8, RA9 for selecting any of four array blocks contained in each sub memory cell array 101 to 104, and the column address signals CA0 to CA9 for selecting one column in each array block are not provided simultaneously. At the time of a cache hit, row address signals are not provided. In the prior art, a block selection can not be performed. In this embodiment, at the time of a cache hit, the block address signals B0, B1 corresponding to the row address signals RA8, RA9 and the column address signals CA0 to CA9 are provided simultaneously. That is, at the time of a cache hit, of an array block and a column in the array block are selected at the same time.

Figure 2:
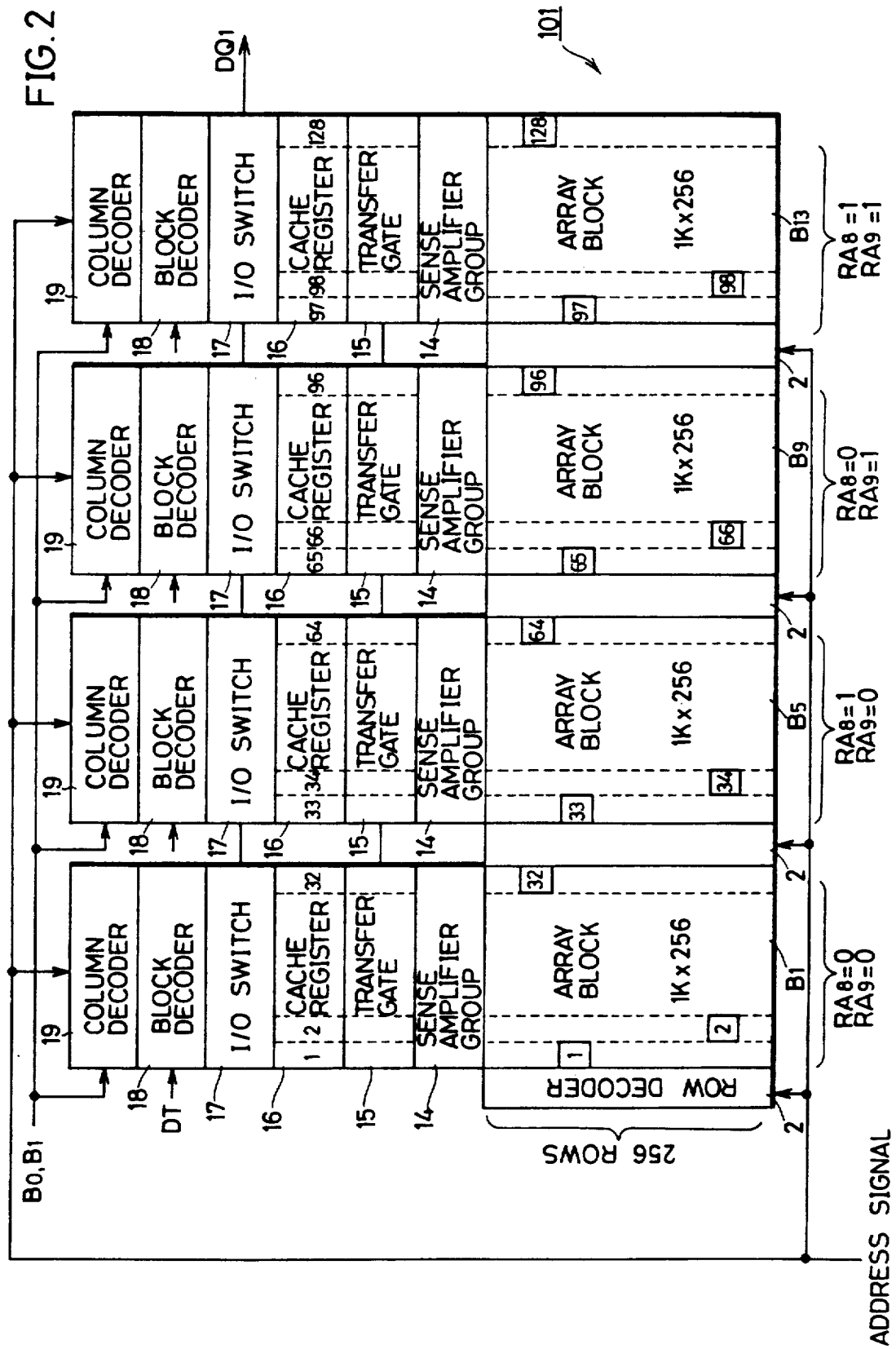
FIG. 2 is a block diagram showing the configuration of one sub memory cell array of the DRAM device in FIG. 1.

FIG. 2 is a block diagram showing the constitution of one sub memory cell array 101 corresponding to an input and output data DQ1 in the memory cell array 1 shown in FIG. 1.

This sub memory cell array 101 is a memory cell array of a dividing operation type in which only ¼ of it selected by the row address signals RA8, RA9 is driven.

Figure 14:
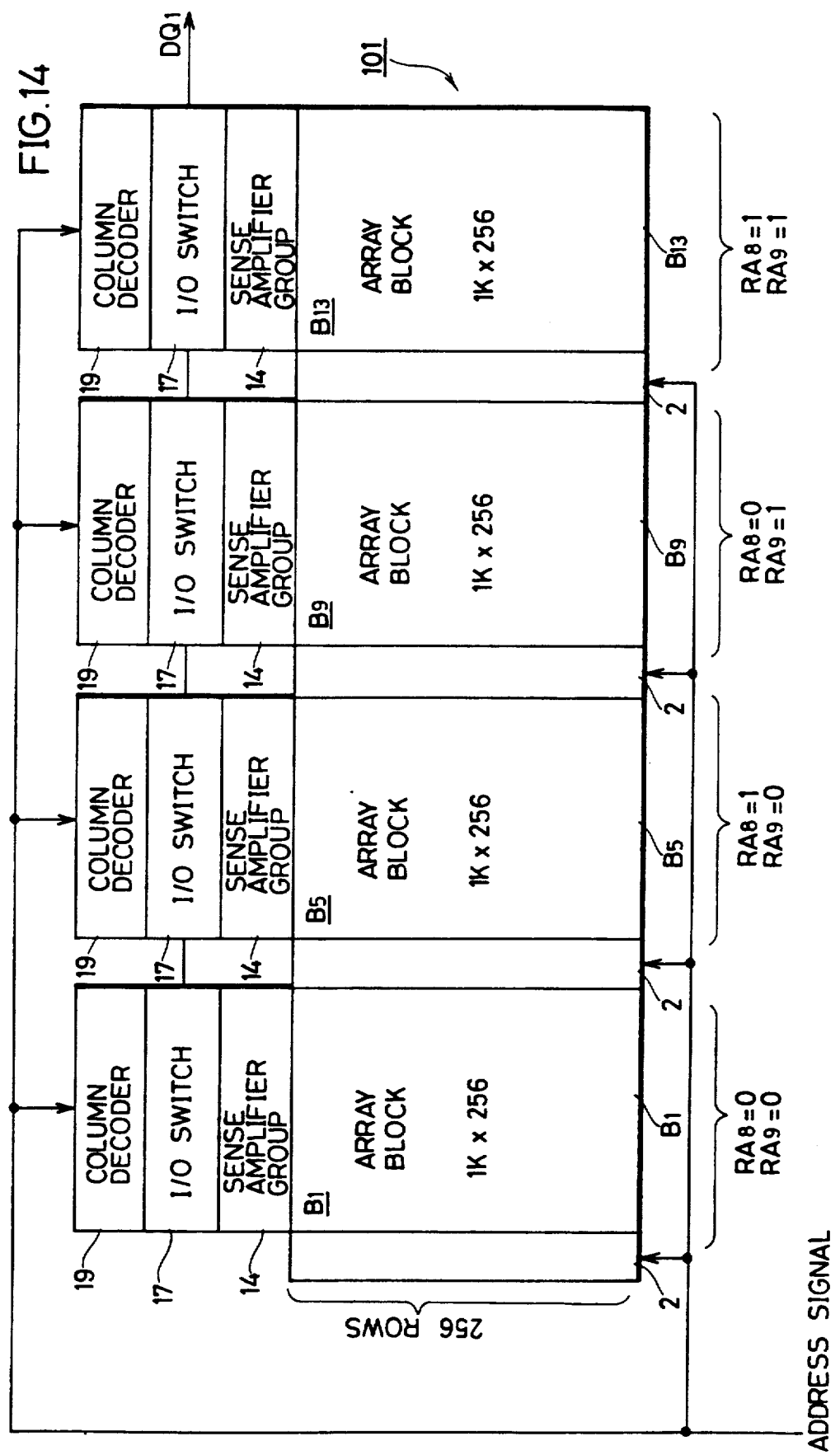
FIG. 14 is a block diagram fully showing the configuration of one sub memory cell array of the DRAM device in FIG. 12.

The sub memory cell array 101, as well as the sub memory cell array 101 in FIG. 14, comprises 4 array blocks B1, B5, B9, B13 of 1K×256 bits. Each array block is divided into 32 sub blocks each containing 32 columns. That is, the sub memory cell array 101 is divided into 128 sub blocks.

Corresponding to each array block, there are provided a sense amplifier group 14, a transfer gate 15, a cache register 16, an I/O switch 17, a block decoder 18 and a column decoder 19.

At the time of a cache miss, any one of four array blocks is selected in response to the row address signals RA8, RA9, and the sense amplifier group 14 and the column decoder 19 which correspond to it is activated. At the same time, in response to the data transferring signal DT, the block decoder 18 corresponding to the selected array block is activated.

At the time of a cache hit, one column decoder 19 is activated in response to the block address signals B0, B1. In this case, the block address signals B0, B1 are applied simultaneously with the column address signals CA0 to CA9, so that one bit of the information out of 4096 bits information held in the four cache registers 16 is selected and supplied as an output at a high speed.

Figure 3:
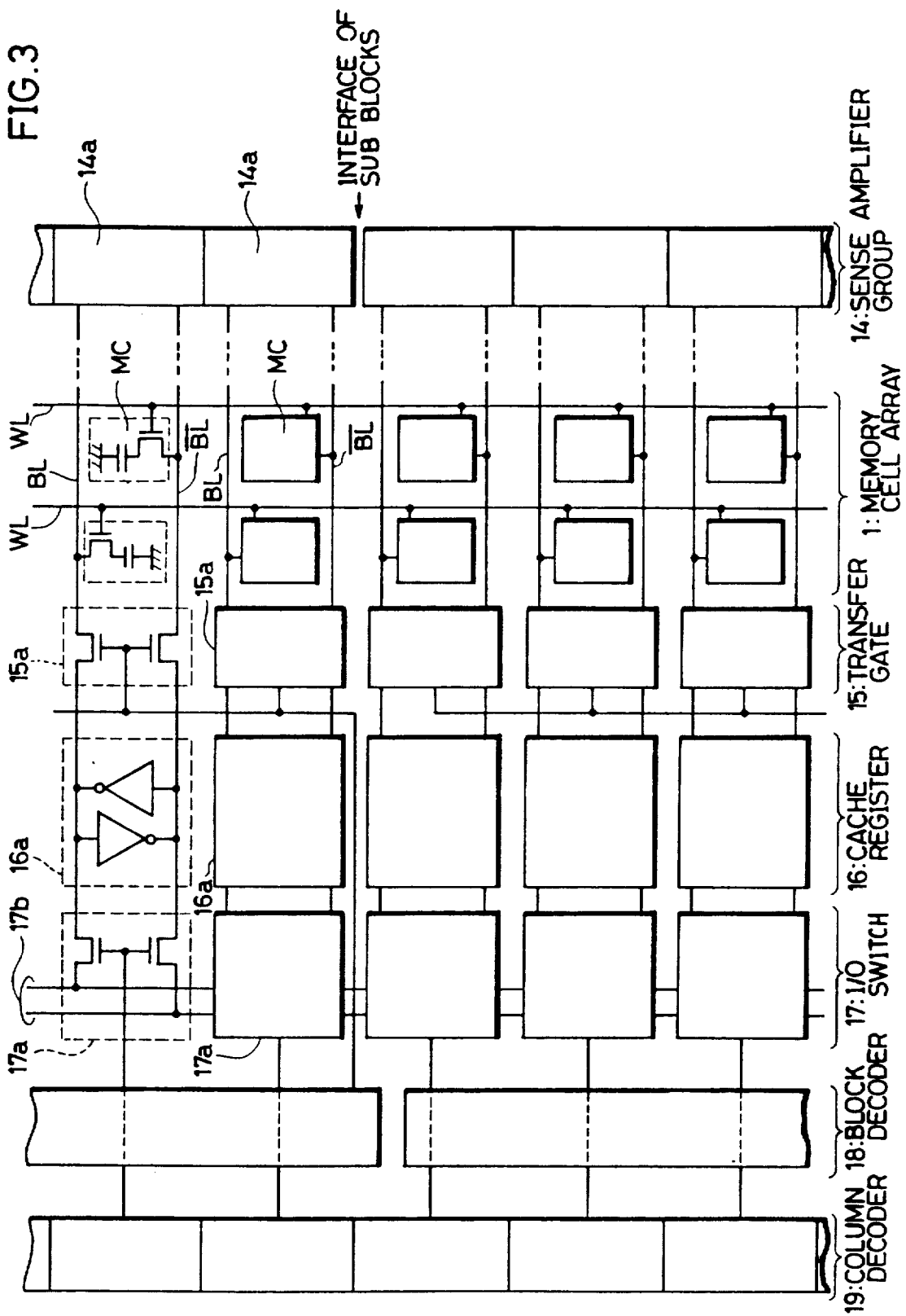
FIG. 3 a block diagram showing the configuration of the important portion of the DRAM device in FIG. 1.

In FIG. 3, the structure of the important portion of FIG. 2 is shown in detail. The sense amplifier group 14 comprises 1K (1024) sense amplifiers 14a, and amplifies and holds the information read out from one row in the corresponding array block.

As shown in FIG. 3, in the memory cell array 1, a plurality of bit line pairs BL, $\overline{BL}$ and a plurality of word lines WL are arranged to intersect each other with a memory cell MC provided at each of those intersections. Each transfer gate 15 comprises 1024 pairs of transfer gate transistors 15a each connected to the bit pairs BL, $\overline{BL}$. Each cache register 16 comprises 1024 registers 16a each connected to the transfer gate transistor 15a. Each I/O switch 17 comprises 1024 sets of I/O switch transistor 17a and I/O line pair 17b each connected to the resistor 16a.

Each block decoder 18 in FIG. 2 is responsive to the column address signals CA5 to CA9 to select one out of 32 sub blocks in the corresponding array block, causing a corresponding transfer gate transistor 15a to turn on. Thus, the information of 32 bits read out from the sub block selected in the array block is transferred to the cache register 16 through the transfer gate 15.

Each column decoder 19 is responsive to the column address signals CA0 to CA4 to select one column out of 32 columns in the selected sub block, causing a corresponding I/O switch transistor 17a to turn on. Thus, the information read out from one selected column in the array block is read out on the I/O line pairs 17b.

Figure 4:
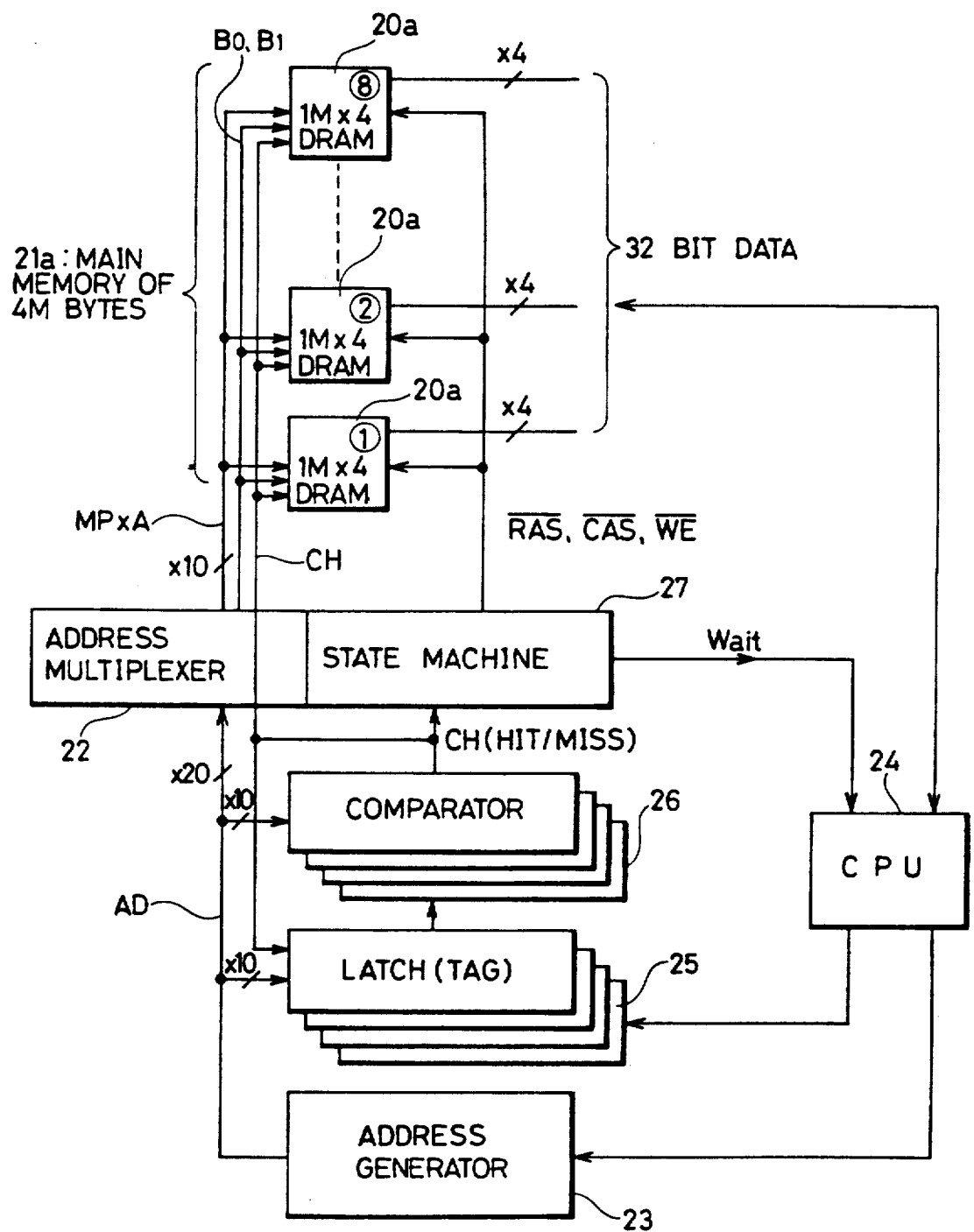
FIG. 4 is a block diagram showing the configuration of a simplified cache system using the DRAM device in FIG. 1.
Figure 5:
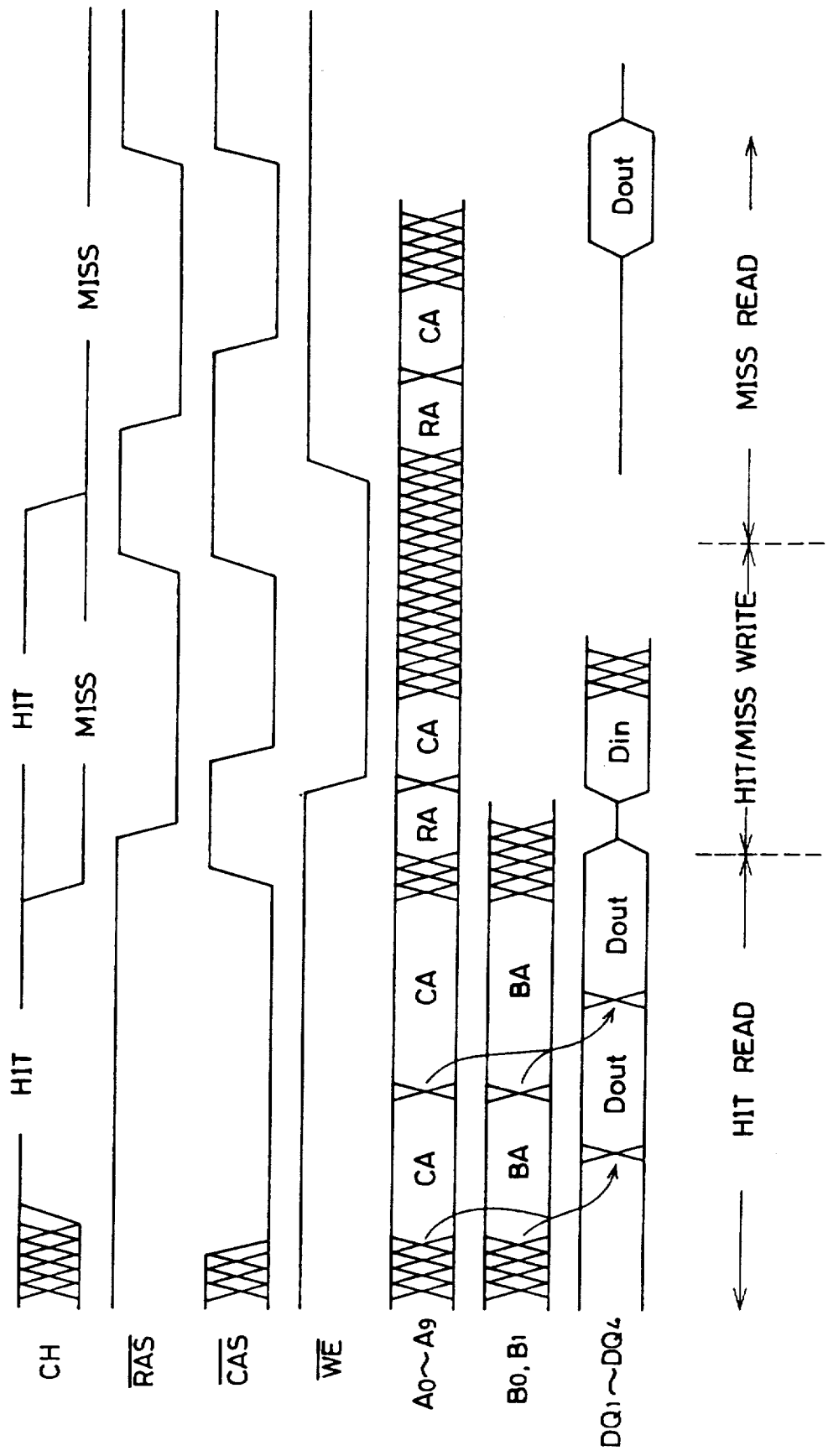
FIG. 5 is a waveform diagram for explaining the operation of the simplified cache system in FIG. 4.

FIG. 4 is a block diagram showing the structure of a simplified cache system using the DRAM device 20a in FIG. 3. FIG. 5 is an operation waveform diagram of the simplified cache system in FIG. 4.

In FIG. 4, the main memory 21a is constituted to have capacity of 4M byte structure by 8 DRAM devices 20a of 1M ×4 bit structure. The simplified cache system in FIG. 4 is different from that of FIG. 15 as follows: the cache hit signal CH supplied from the comparator 26 is also applied to each DRAM device 20a ; and two signal lines for supplying block address signals B0, B1, besides 10 address lines, are connected from the address multiplexer 22 to each DRAM device 20a.

The operation of the simplified cache system in FIG. 4 will now be described with reference to the operation waveform diagram in FIG. 5.

In a latch (tag) 25, for each sub memory cell array, 128 pairs of cache address sets comprising 10 bit address signals RA0 to RA9 and 5 bit column address signals CA5 to CA9 are held. As this cache address set, for example, a pair of addresses selected in the previous cycle, or a pair of addresses frequently used is selected. One row of information in one sub block is selected by each address set. The selected, 32 bit information thus forms one data block. Accordingly, in this simplified cache system, the size of each data block is 32 bits and the number of entries is 128.

In the cache register 16 in each DRAM device 20a (FIG. 2), 128 data blocks corresponding to 128 pairs of data sets held in the latch 25 is stored.

The CPU 24 generates an address signal AD of 20 bits corresponding to the data which it requires. The comparator 26 compares the 10 bit row address signals RA0 to RA9 and the 5 bit column address signals CA5 to CA9 of the 20 bit address signals AD with the 128 pairs of cache address sets held in the latch 25. If the row address signals RA0 to RA9 and the column address signals CA5 to CA9 coincide with any of the cache address sets, the comparator 26 generates a cache hit signal CH. The state machine 27 is responsive to the cache hit signal CH to cause the column address strobe signal $\overline{CAS}$ to fall to a low level while maintaining the row address strobe signal $\overline{RAS}$ at a high level. The address multiplexer 22 simultaneously applies, along with 10 bit column address signals CA0 to CA9, 2 bit block address signals B0, B1 corresponding to the row address signals RA8, RA9 to each DRAM device 20a.

At this time, in each DRAM device 20a, each block decoder 18 (FIG. 2) is not activated by the cache hit signal CH. Therefore, each array block and each cache register 16 keep insulated from each other. One bit of information in the cache register 16 is supplied to the outside through the I/O switch transistor 17a, the I/O line pair 17b (FIG. 3), and the data output buffer 11 (FIG. 1) based on the column address signals CA0 to CA9 and the block address signals B0, B1.

At the time of a hit read, 4 bit output data DQ1 to DQ4, at a high speed, may be obtained from the cache register 16 of each DRAM device 20a at an access time $t_{CAC}$ as in a page mode.

If the row address signals RA0 to RA9 and the column address signals CA5 to CA9 generated from the address generator 23 do not coincide with any of 128 pairs of address sets held in the latch 25, the comparator 26 does not generate a cache hit signal CH. In this case, a RAS/CAS control of a normal read cycle is performed by the state machine 27, and the address multiplexer 22 in turn applies the row address signals RA0 to RA9 and the column address signals CA0 to CA9 as multiplexed address signals MPXA to each DRAM device 20a.

At the time of a cache miss, 4 bit output data DQ1 to DQ4, at a low speed, may be obtained at an access time $t_{RAC}$, so that the state machine 27 generates a wait signal Wait, causing the CPU 24 to be in a stand-by state.

In this case, the transfer gate 15 is controlled by the block decoder 18, and the data blocks of 32 bits comprising the information accessed are collectively transferred from the array blocks to the cache registers 16 through the transfer gates 15 (see FIG. 3). At this time, in the latch 25 shown in FIG. 4, a cache address set comprising the row address signals RA0 to RA9 and the column address signals CA5 to CA9 corresponding to the data blocks is held.

The case in which a cache hit occurs in the read operation is called a "hit read", where as the case in which a cache miss occurs in the read operation is called a "miss read". The case in which a cache hit occurs in the write operation is called a "hit write", where as the case in which a cache miss occurs in the write operation is called a "miss write".

As shown in FIG. 5, at the time of a hit write and a miss write, almost the same operation is performed as that at the time of the miss read.

Figure 6:
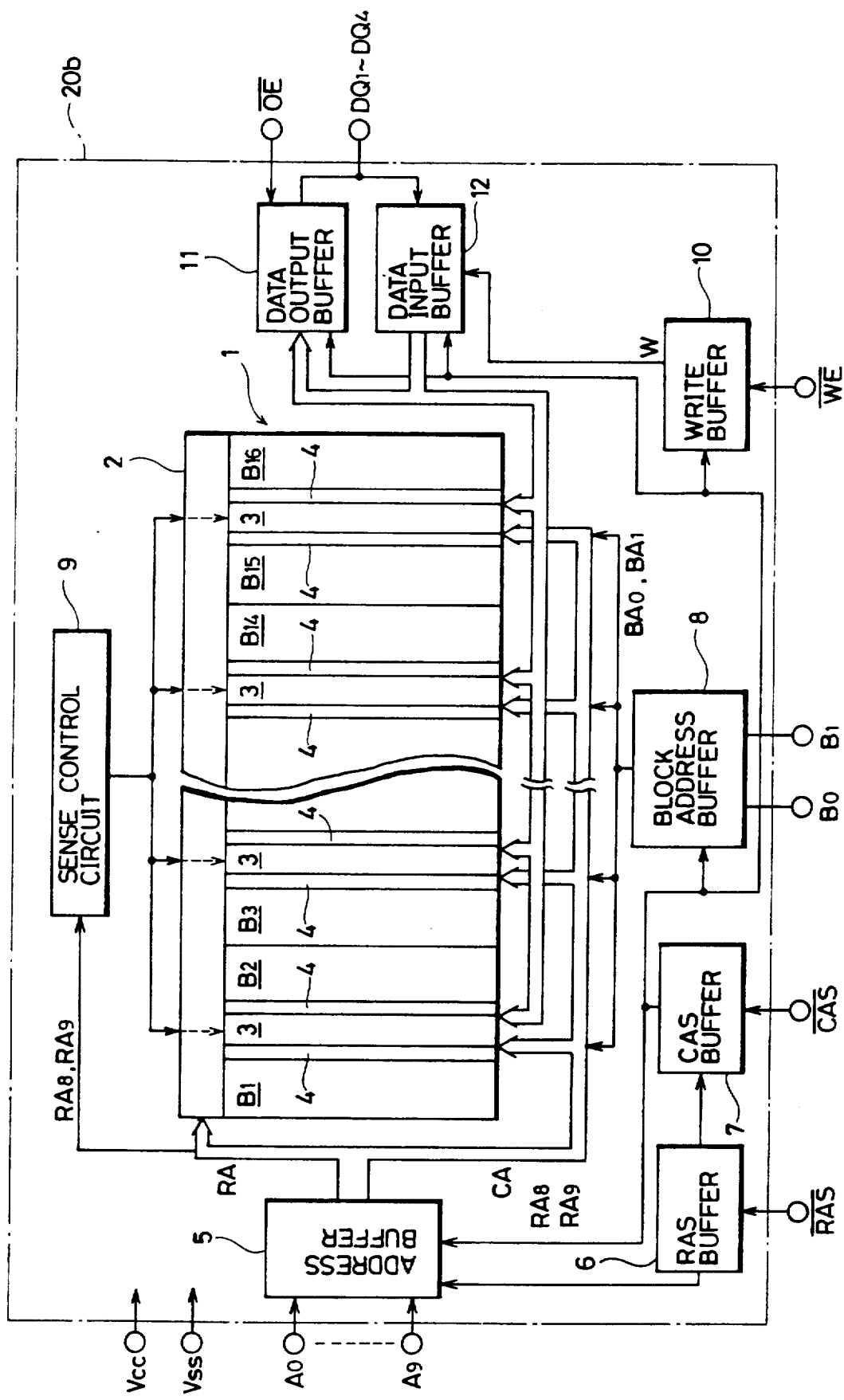
FIG. 6 is a block diagram showing the configuration of a DRAM device in accordance with a second embodiment of the present invention.

FIG. 6 is a block diagram showing the structure of a DRAM device of 1M×4 bit structure in accordance with a second embodiment of the present invention.

In FIG. 6, the DRAM device 20b comprises a memory cell array 1 of 1M×4 bits. The structure of the memory cell array 1 is the same as those of memory cell arrays 1 shown in FIGS. 12 to 14. Accordingly, in the DRAM device 20b of FIG. 6, there is no transfer gate 15, no cache register 16 and no block decoder 18 as shown in FIG. 2. In the DRAM device 20b of FIG. 6, as well as the DRAM device 20a of FIG. 1, a block address buffer 8 is provided which receives externally applied block address signals B0, B1. However, in the DRAM device 20b of FIG. 6, there is no cache hit buffer 13 for receiving an externally applied cache hit signal CH as in the DRAM device 20a of FIG. 1.

The DRAM device 20b of FIG. 6, is based on the assumption that it is operated in accordance with a method in which the sense amplifier portion 4 is reset simultaneously with the row address strobe signal $\overline{RAS}$ attaining a low level to cause the read or write cycle to start. That is, it is assumed that the same is in accordance with a method in which the sense amplifier portion 4 is reset immediately before the word line is selectively driven. Accordingly, the row of information selected in the previous cycle is stored in the sense amplifier portion 4 all the time.

Figure 7:
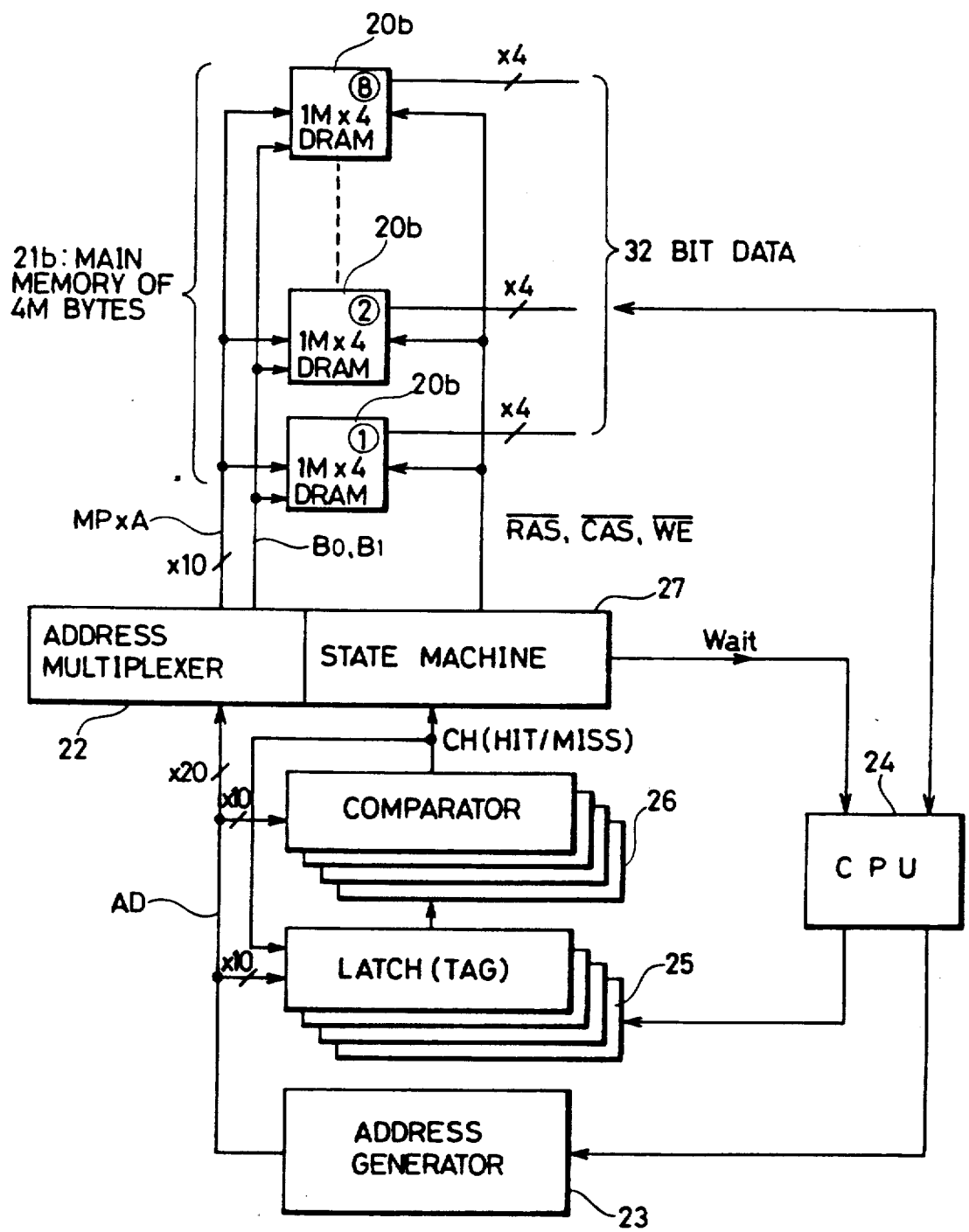
FIG. 7 is a diagram showing the configuration of a simplified cache system using the DRAM device in FIG. 6.

FIG. 7 is a block diagram showing the structure of a simplified cache system using the DRAM device 20b of FIG. 6.

In FIG. 7, the main memory 21b is structured to have capacity of 4M bytes by 8 DRAM devices 20b of 1M×4 bit structure. The simplified cache system in FIG. 7 is different from that of FIG. 4 in that the cache hit signal CH applied from the comparator 26 is not supplied to each DRAM device 20b.

The operation of the simplified cache system in FIG. 7 will now be summarized. In the latch 25, for each sub memory cell array, 4 cache address sets comprising 8 bit row address signals RA0 to RA7 and 2 bit row address signals RA8, RA9 are held. One row (1024 bits) of information selected by the row address signals RA0 to RA7 held in the latch 25 is held in each sense amplifier group in each DRAM device 20b. The information held in each sense amplifier group is the row of information selected at the latest cycle in the corresponding array block. Therefore, in the simplified cache system of FIG. 7, the size of each data block is 1024 bits while the number of entries being 4.

The address generator 23 generates addresses of data which the CPU 24 requires. The comparator 26 compares 10 bit row address signals RA0 to RA9 out of 20 bit address signals AD with 4 cache address sets held in the latch 25. If the row address signals RA0 to RA9 coincide with any of the 4 cache address sets, the comparator 26 generates a cache hit signal CH.

The state machine 27 is responsive to the cache hit signal CH to perform a page mode control in which the column address strobe signal $\overline{CAS}$ is toggled while maintaining the row address strobe signal $\overline{RAS}$ at a low level. The address multiplexer 22 simultaneously applies the column address signals CA0 to CA9 and the block address signals B0, B1 to each DRAM device 20b. Thus, in each DRAM device 20b, one bit of information out of the information held in the sense amplifier group is supplied to the outside through the I/0 switch, the I/0 bus and the output buffer based on the column address signals CA0 to CA9 and the block address signals B0, B1.

The simplified cache system of FIG. 7 is different from that of FIG. 15 as follows: in the simplified cache system of FIG. 15, only the row address signals RA0 to RA7 corresponding to one row selected immediately before are held in the latch 25 whereas, in the simplified cache system of FIG. 7, the group of the row address signals RA8, RA9, the number of which is equal to that of the divided array blocks, is held as well as the group of the row address signals RA0 to RA7.

Figure 15:
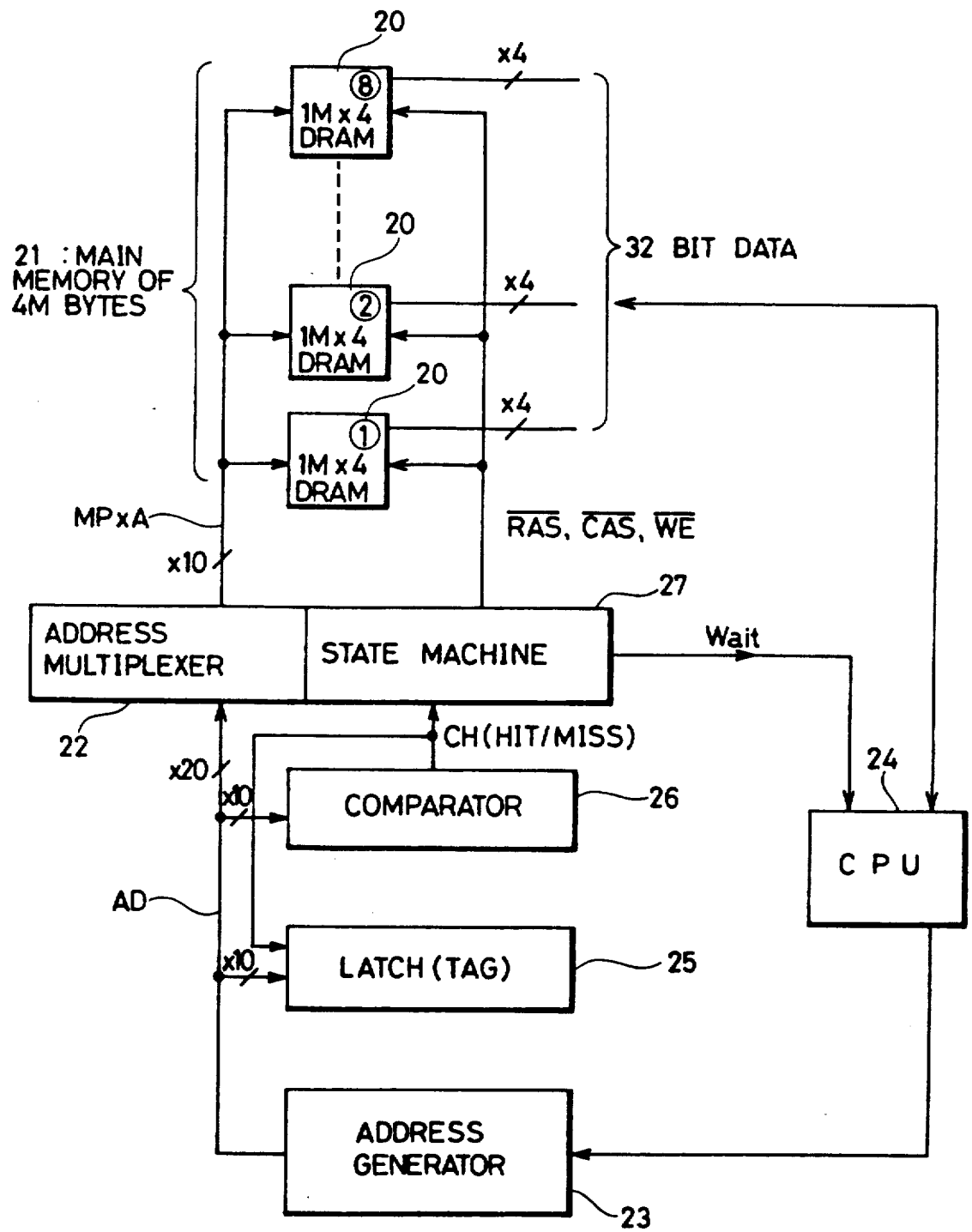
FIG. 15 is a block diagram showing the configuration of a simplified cache system using a DRAM device in FIG. 12.
Figure 16:
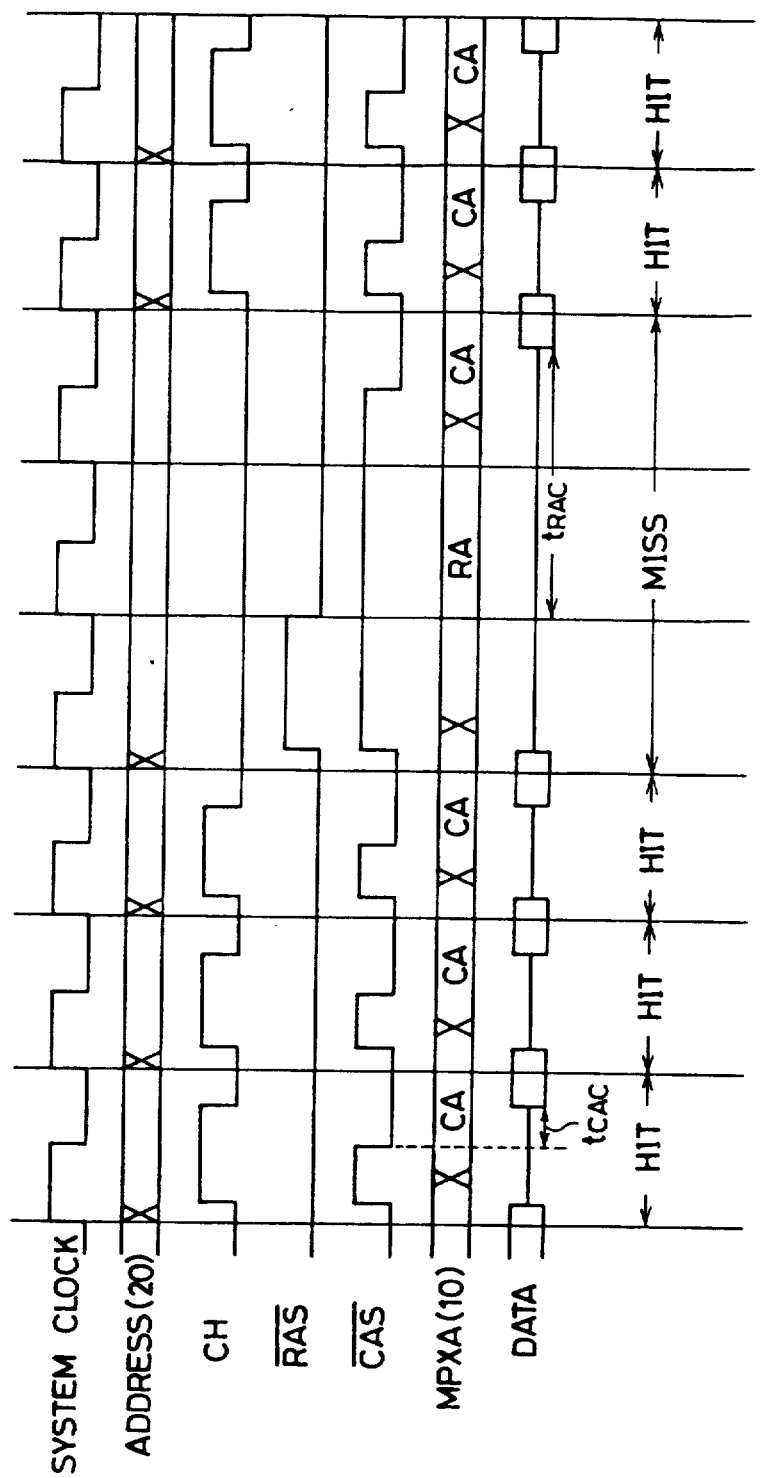
FIG. 16 is a waveform diagram for explaining the operation of the simplified cache system in FIG. 15.

Accordingly, while the number of entries is 1 in the simplified cache system of FIG. 15, it becomes possible to provide entry, the number of which is equivalent to that of the divided array blocks in the simplified cache system of FIG. 7.

Figure 8:
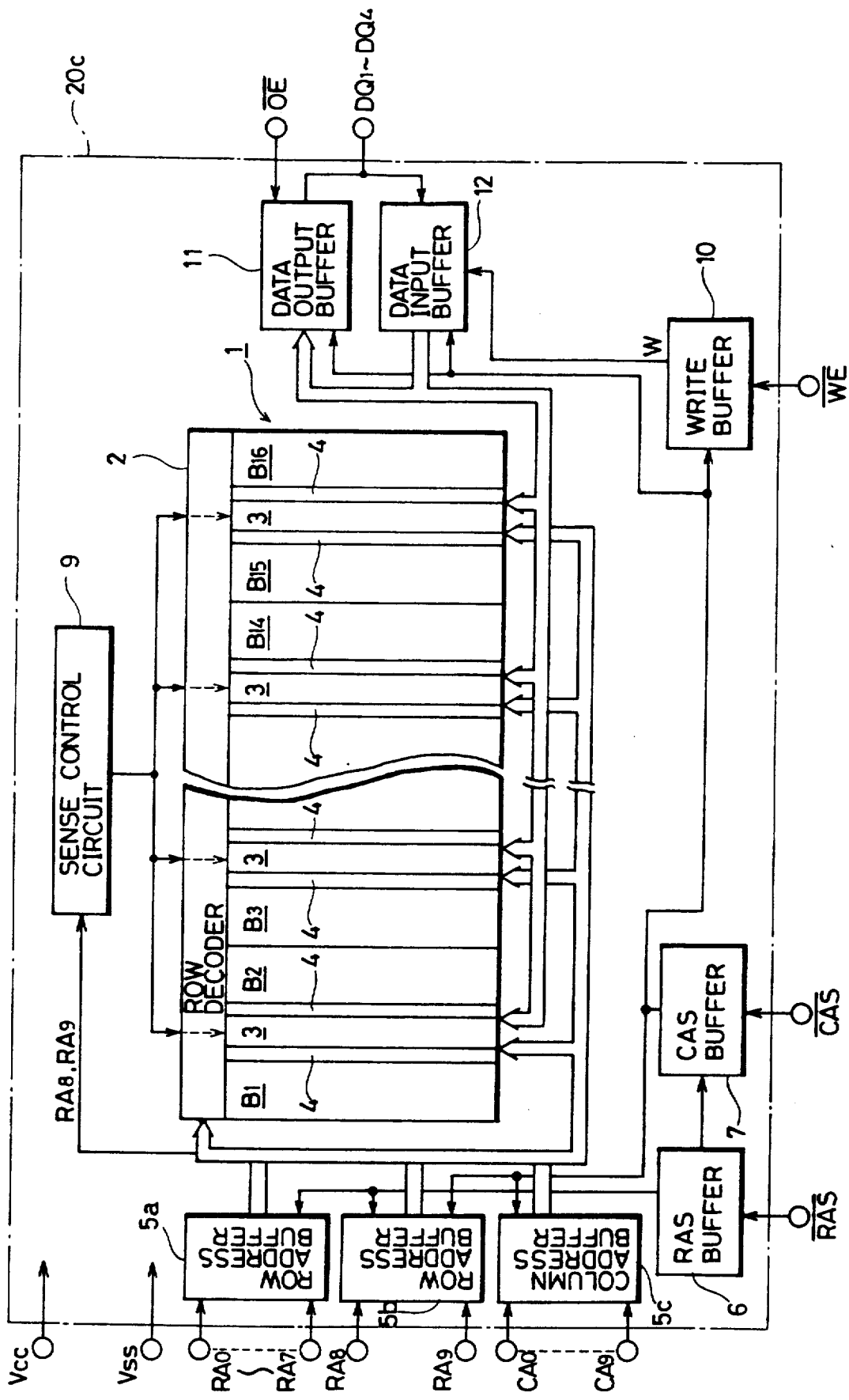
FIG. 8 is a block diagram showing the configuration of a DRAM device in accordance with a third embodiment of the present invention.

FIG. 8 is a block diagram showing the structure of a DRAM device of 1M×4 bit structure in accordance with a third embodiment of the present invention.

In FIG. 8, the DRAM device 20c comprises a memory cell array 1 which is the same as the memory cell array 1 in the DRAM device 20b of FIG. 6. The DRAM device 20c of FIG. 8 is provided with the row address signals RA0 to RA9 and the column address signals CA0 to CA9 simultaneously without being multiplexed. Therefore, in the DRAM device 20c, there are provided a row address buffer 5a for receiving the row address signals RA0 to RA7, a row address buffer 5b for receiving the row address signals RA8, RA9, and a column address buffer 5c for receiving the column address signals CA0 to CA9.

That is, in the DRAM device 20c of FIG. 8, 20 address input terminals are provided in order to simultaneously apply the row address signals RA0 to RA9 and the column address signals CA0 to CA9.

In the DRAM device 20c, there is no block address buffer 8 as in the DRAM device 20b of FIG. 6.

In this DRAM device 20c, at the time of a cache hit, the row address signals RA8, RA9 are provided simultaneously with the column address signals CA0 to CA9. A conventional DRAM device for receiving row address signals and column address signals which are not multiplexed is structured such that all the row address signals including the row address signals RA8, RA9 become invalid (are not taken in the chip) in a period of time during which the column address signals are valid.

Figure 9:
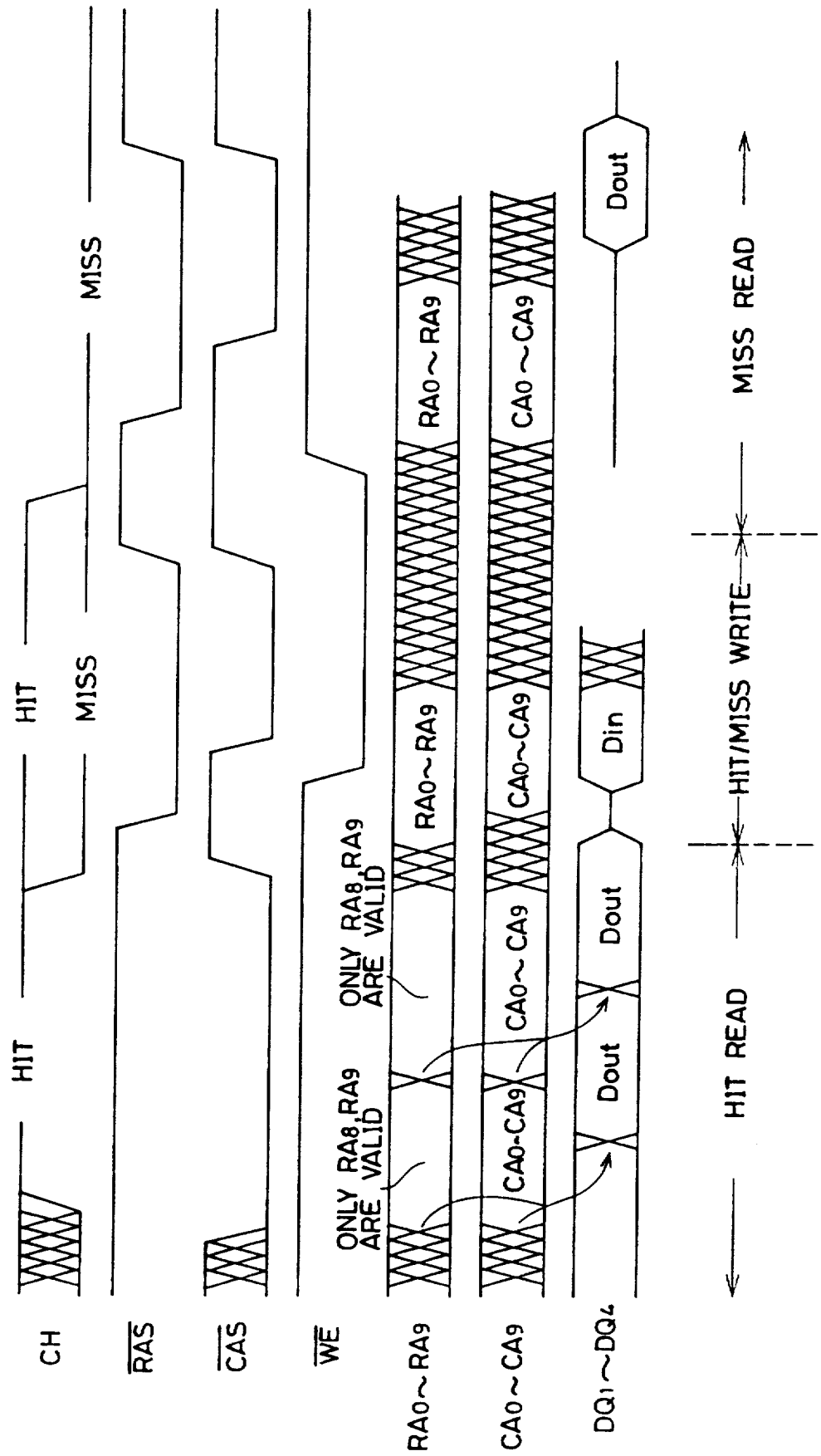
FIG. 9 is a waveform diagram for explaining the operation of the DRAM device in FIG. 8.
Figure 11A:
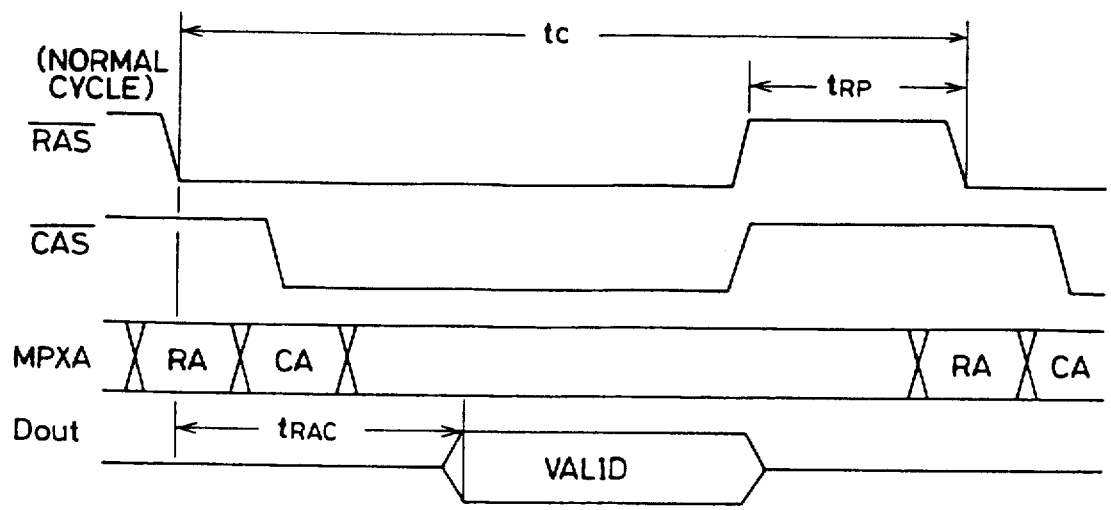
FIG. 11A is a waveform diagram for describing a normal read cycle of a DRAM device.
Figure 11B:
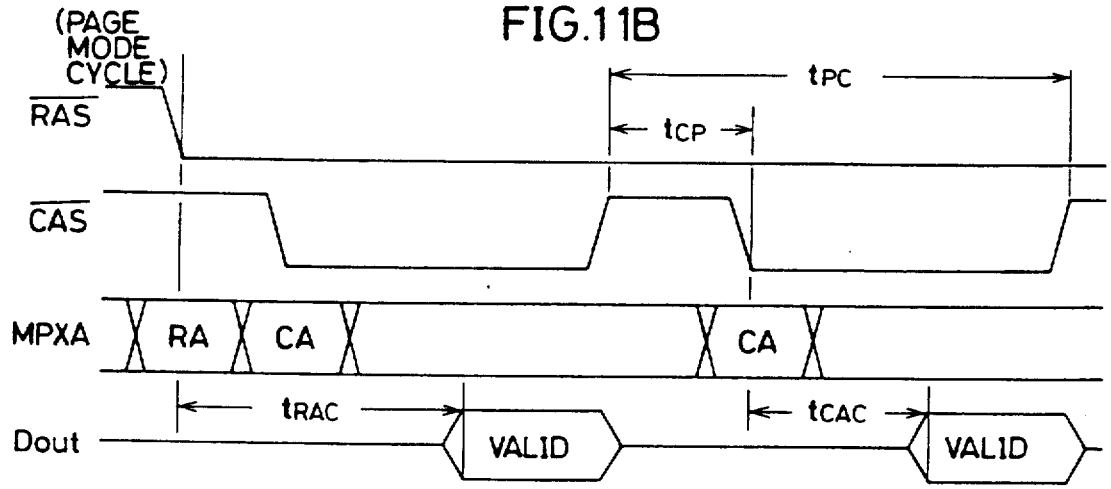
FIG. 11B is a waveform diagram for explaining a page mode cycle of a DRAM device.
Figure 11C:
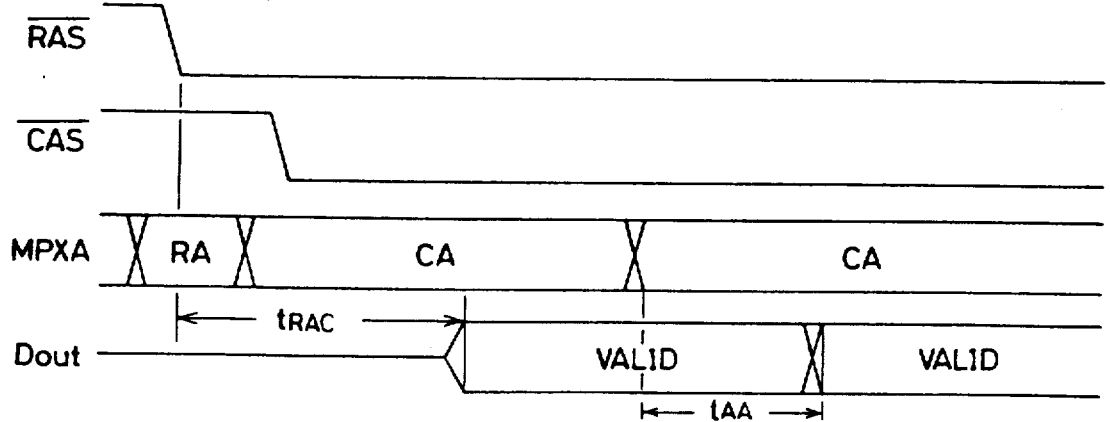
FIG. 11C is a waveform diagram for explaining a static column mode cycle of a DRAM device.

FIG. 9 is an operation waveform diagram of the DRAM device 20c of FIG. 8. The row address signals RA0 to RA9 and the column address signals CA0 to CA9 which are not multiplexed are applied to the DRAM device 20c. At the time of a hit read, the row address signals RA8, RA9 with respect to the dividing operation, in addition to the column address signals CA0 to CA9, become valid to be taken in the chip. As a result, an access to the sense amplifier which functions as a cache memory is made. At the time of a miss read, a hit write and a miss write, the row address signals RA0 to RA9 and the column address signals CA0 to CA9 are taken in the chip in the same manner as the DRAM device which receives a multiplexed address signal.

In the DRAM device 20c of FIG. 8, as in the DRAM device 20b of FIG. 6, the block size is 1024 bits and the number of entries is 4.

While, in the embodiment of FIG. 8, a case has been described in which the embodiment of FIG. 6 is applied to the DRAM device for receiving a row address signal and a column address signal which are not multiplexed, it is also possible to apply the embodiment of FIG. 1 to the DRAM device for receiving an address signal which is not multiplexed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device with a built-in cache memory capable of a first operation mode in which a normal access is made and a second operation mode in which a high speed access is made, comprising:

a memory cell array (1) having a plurality of memory cells (MC) arranged to have a plurality of rows and a plurality of columns, said memory cell array (1) being divided into a plurality of blocks (B1 to B16), said each block being divided into a plurality of sub blocks each having a plurality of columns;

signal receiving means (5, 8; 5a, 5b, 5c) which, at a time of said first operation mode, in a time-sharing manner or simultaneously, receives a row address signal (RA) and a column address signal (CA) applied externally, while, at a time of said second operation mode, simultaneously receiving block selecting signals (B0, B1) and a column address signal (CA) applied externally;

a first selecting means (19) responsive to a part of said row address signals (FA8, RA9) for selecting any of said plurality of blocks (B1 to B16) at the time of said first operation mode, and responsive to said block selecting signals (B0, B1) for selecting any of said plurality of blocks (B1 to B16) at the time of said second operation mode;

a second selecting means (2) responsive to the remaining of said row address signals (RA0 to RA7) for selecting any row in said selected block at the time of said first operation mode;

a plurality of sense amplifier means (14a) associated with said plurality of columns in said each block for amplifying and holding the information read out from said selected row;

a plurality of information holding means (16a) provided in response to associated with said plurality of columns in said each block for holding information;

a third selecting means (18) responsive to a part of said column address signals (CA5 to CA9) for selecting any of said plurality of sub blocks in said selected block at the time of said first operation mode;

an information transferring means (15) for transferring information between the row selected by said second selecting means (2) and a corresponding information holding means (16a) in said selected sub block at the time of said first operation mode; and a fourth selecting means (19) responsive to said column address signal (CA) for selecting any of the plurality of sense amplifier means (14a) in said selected block at the time of said first operation mode, and responsive to said column address signal (CA) for selecting any of the plurality of information holding means (16a) corresponding to said selected block at the time of said second operation mode, said first selecting means (19) and said fourth selecting means (19) being controlled to operate simultaneously at the time of said second operation mode.

2. A semiconductor memory device according to claim 1, wherein said first fourth selecting means comprise a column decoder (19), said second selecting means comprises a row decoder (2), and said third selecting means comprises a block decoder (18).

3. A semiconductor memory device according to claim 1, wherein said signal receiving means comprises:

an address buffer (5) for receiving a column address signal (CA) and a row address signal (RA) in a time-sharing manner; and a block selecting signal buffer (8) for receiving block selecting signals (B0, B1).

4. A semiconductor memory device according to claim 1, wherein said signal receiving means comprises:

a first row address buffer (5b) for receiving a part of the row address signals (RA8, RA9);

a second row address buffer (5a) for receiving the remaining of the row address signals; and a column address buffer (5c) for receiving a column address signal CA), the part of said row address signals (RA8, RA9) being used as said block selecting signals (B0, B1) at the time of said second operation mode.

5. A semiconductor memory device according to claim 1, wherein said first operation mode corresponds to a cache miss, and said second operation mode corresponds to a cache hit.

6. A semiconductor memory device according to claim 5 further comprising:

a cache hit buffer (13) for receiving a cache hit signal at the time of a cache hit, said information transferring means (15) being responsive to said cache hit signal to be enabled, and said third selecting means (18) being responsive to said cache hit signal to be disabled.

7. A semiconductor memory device according to claim 1, wherein said memory cell array (1), said signal receiving means (5, 8; 5a, 5b, 5c), said first selecting means (19), said second selecting means (2), said plurality of sense amplifier means (14a), said third selecting means (18), said information transferring means (15), and said fourth selecting means (19) are formed on one chip.

8. A cache memory system comprising:

decision means (25, 26) for deciding when a cache hit and a cache miss occur;

address generating means (22, 23) for generating a row address signal (RA) and a column address signal (CA) at a time of a cache miss, and for generating block selecting signals (B0, B1) and a column address signal (CA) at a time of a cache hit;

a semiconductor memory device including a memory cell array (1) having a plurality of memory cells (MC) arranged to have a plurality of rows and a plurality of columns, said memory cell array (1) being divided into a plurality of blocks (B1 to B16), and said each block being divided into a plurality of sub blocks each having a plurality of columns, signal receiving means (5, 8; 5a, 5b, 5c) which, at the time of a cache miss, in a time-sharing manner or simultaneously, receive a row address signal (RA) and a column address signal (CA) applied externally, while, at the time of said cache hit, simultaneously receiving block selecting signals (B0, B1) and a column address signal (CA) applied externally, a first selecting means (19) responsive to a part of said row address signals (RA8, RA9) for selecting any of said plurality of blocks (B1 to B16) at the time of a cache miss while being responsive to said block selecting signals (B0, B10) for selecting any of said plurality of blocks (B1 to B16) at the time of a cache hit, a second selecting means (2) responsive to the remaining of said row address signals (RA0 to RA7) for selecting any row in said selected block at the time of a cache miss, a plurality of sense amplifier means (14a) associated with said plurality of columns in said each block for amplifying and holding the information read out from said selected row, a plurality of information holding means (16a) associated with said plurality of columns in said each block for holding information, a third selecting means (18) responsive to apart of said column address signals (CA5 to CA9) for selecting any of said plurality of sub blocks in said selected block at the time of a cache miss, an information transferring means (15) for transferring information between the row selected by said second selecting means (2) and a corresponding information holding means (16a) in said selected sub block at the time of a cache miss, a fourth selecting means (19) responsive to said column address signal (CA) for selecting any of the plurality of sense amplifier means (14a) in said selected block at the time of a cache miss, and responsive to said column address signal (CA) for selecting any of the plurality of information holding means (16a) corresponding to said selected block at the time of a cache hit, said first selecting means (19) and said fourth selecting means (19) being controlled to operate simultaneously at the time of a cache hit.

9. An operation method of a semiconductor memory device with a built-in cache memory, said semiconductor memory device comprising a memory cell array (1) having a plurality of memory cells (MC) arranged to have a plurality of rows and a plurality of columns, said memory cell array (1) being divided into a plurality of blocks (B1 to B16), and said each block being divided into a plurality of sub blocks each having a plurality of columns; a plurality of sense amplifier means (14a) provided in response to said plurality of columns in said each block for amplifying and holding the information read out from a corresponding column; and a plurality of information holding means (16a) provided in response to said plurality of columns in said each block for holding the information, said method comprising the steps of:

receiving, in a time-sharing manner or simultaneously, a row address signal (RA) and a column address signal (CA) applied externally, at a time of said first operation mode, and simultaneously receiving block selecting signals (B0, B1) and a column address signal (CA) applied externally, at a time of said second operation mode;

selecting any of said plurality of blocks (B1 to B16) in response to a part of said row address signals (RA0, RA9) at the time of said first operation mode;

selecting any row in said selected block in response to the remaining of said row address signals (RA0 to RA7) at the time of said first operation mode;

selecting any of said plurality of sub blocks in said selected block in response to a part of said column address signals (CA5 to CA9) at the time of said first operation mode;

selecting any of the plurality of sense amplifier means in said selected block in response to said column address signal (CA) at the time of said first operation mode;

transferring information between the selected row and a corresponding information holding means (16a) in said selected sub block at the time of said first operation mode;

selecting any of said plurality of blocks (B1 to B16) in response to said block selecting signals (B0, B1), and at the same time, selecting any of the plurality of information holding means (16a) corresponding to said selected block in response to said column address signal (CA) at the time of said second operation mode.

10. An operation method of a cache memory system using a semiconductor memory device with a built-in cache memory, said semiconductor memory device comprising a memory cell array (1) having a plurality of memory cells (MC) arranged to having a plurality of rows and a plurality of columns, said memory cell array (1) being divided into a plurality of blocks (B1 to B16), and said each block being divided into a plurality of sub blocks each having a plurality of column; a plurality of sense amplifier means (14a) provided in response to said plurality of columns in said each block for amplifying and holding the information read out from said selected row; and a plurality of information holding means (16a) associated with said plurality of columns in said each block for holding information, said method comprising the steps of:

dividing when a cache hit and a cache miss occur;

generating a row address signal (RA) and a column address signal (CA) at a time of a cache miss while generating block selecting signals (B0, B1) and a column address signal (CA) at a time of a cache hit;

receiving, in a time-sharing manner or simultaneously, a row address signal (RA) and a column address signal (CA) applied externally, at the time of a cache miss while simultaneously receiving block selecting signals (B0, B1) and a column address signal applied externally, at the time of a cache hit;

selecting any of said plurality of blocks (B1 to B16) in response to a part of said row address signals (RA8, RA9) at the time of a cache miss;

selecting any row in said selected block in response to the remaining of said row address signals (RA0 to RA7) at the time of a cache miss;

selecting any of said plurality of sub blocks in said selected block in response to a part of said column address signals (CA5 to CA0 at the tie of a cache miss;

selecting any of the plurality of sense amplifier means (16a) in said selected block in response to said column address signal (CA) at the time of a cache miss;

transferring information between the selected row and a corresponding information holding means (16a) in said selected sub block at the time of a cache miss;

selecting any of said plurality of blocks (B1 to B16) in response to said block selecting signals (B0, B1), and at the same time, selecting any of the plurality of information holding means (16a) corresponding to said selected block in response to said column address signal (CA) at the time of a cache hit.

11. A semiconductor memory device with a built-in cache memory capable of a first operation mode in which a normal access in made and a second operation mode in which a high-speed access is made, comprising:

a memory cell array (1) having a plurality of memory cells (MD) arranged to have a plurality of rows and a plurality of columns, said memory cell array (1) being divided into a plurality of blocks (B1 to B16);

signal receiving means (5, 8; 5a, 5b, 5c) which, at a time of said first operation mode, in a time-sharing manner or simultaneously, receive a row address signal (RA) and a column address signal (CA) applied externally while, at a time of said second operation mode, simultaneously receiving block selecting signals (B0, B1) and a column address signal (CA) applied externally;

a first selecting means (19) responsive to a part of said row address signals (RA8, RA9)for selecting any of said plurality of blocks (B1 to B16) at the time of said first operation mode while being responsive to said block selecting signals (B0, B1) for selecting any of said plurality of blocks (B1 to B16) at the time of said second operation mode;

a second selecting means (2) responsive to the remaining of said row address signals (RA0 to RA7) for selecting any row in said selected block at the time of said first operation mode;

a plurality of information holding means (14a) associated with said plurality of columns in said each block for holding the information read out from said selected row; and a third selecting means (19) responsive to said column address signal (CA) for selecting any of the plurality of information holding means (14a) in said selected block at the time of said first and second operation modes, said first selecting means (19) and said third selecting means (19) being controlled to operate simultaneously at the time of said second operation mode.

12. A semiconductor memory device according to claim 11, wherein said first and second selecting circuits comprise a column decoder (19), and said second selecting means comprises a row decoder (2).

13. A semiconductor memory device according to claim 11, wherein said signal receiving means comprises:

an address buffer (5) for receiving a column address signal (CA) and a row address signal (RA) in a time-sharing manner; and a block selecting signal buffer (8) for receiving block selecting signals (B0, B1).

14. A semiconductor memory device according to claim 11, wherein said signal receiving means comprises:

a first row address buffer (5b) for receiving a part of the row address signals (RA8, RA9);

a second row address buffer (5a) for receiving the remaining of the row address signals (RA0 to RA7); and a column address buffer (5c) for receiving a column address signal (CA), the part of said row address signals (RA8, RA9) being used as said block selecting signals (B0, B10at the time of said second operation mode.

15. A semiconductor memory device according to claim 11, wherein said first operation mode corresponds to a cache miss, and said second operation mode corresponds to a cache hit.

16. A semiconductor memory device according to claim 11, wherein said memory cell array (1), said signal receiving means (5, 8; 5a, 5b, 5c), said first selecting means (19), said second selecting means (2), said plurality of information holding means (14a), said third selecting means (18), said information transferring means (15), and said fourth selecting means (19) are formed on one chip.

17. A semiconductor memory device according to claim 11, wherein
said plurality of information holding means comprises a plurality of sense amplifier means (14a) associated with said plurality of columns in said each block for amplifying and holding the information read out from said selected row;

18. A cache memory system comprising:
decision means (25, 26) for deciding when a cache hit and a cache miss occur;
address generating means (22, 23) for generating a row address signal (RA) and a column address signal (VA) at a time of a cache miss while generating block selecting signals (B0, B1) and a column address signal (CA) at a time of a cache hit; and
semiconductor memory devices (2b, 2c) including:
a memory cell array (1) having a plurality of memory cells (MC) arranged to have a plurality of rows and a plurality of columns,
said memory cell array (1) being divided into a plurality of blocks (B1 to B16);
signal receiving means (5, 8; 5a, 5b, 5c) which, at the time of a cache miss, in a time-sharing manner or simultaneously, receive a row address signal (RA) and a column address signal (CA) applied externally while, at the time of a cache hit, simultaneously receiving block selecting signals (B0, B1) and a column address signal applied externally;
a first selecting means (19) responsive to a part of said row address signals (RA8, RA9) for selecting any of said plurality of blocks (B1 to B16) at the time of a cache miss while being responsive to said block selecting signals (B0, B1) for selecting any of said plurality of blocks (B1 to B16) at the time of a cache hit;
a second selecting means (2) responsive to the remaining of said row address signals (RA0 RA7) for selecting any row in said selected block at the time of said cache miss;
a plurality of sense amplifier means (14a) associated with said plurality of columns in said each block for amplifying and holding information read out from said selected row; and
a third selecting means (19) responsive to said column address signal (CA) for selecting any of the plurality of sense amplifier means (14a) in said selected block at the time of said cache miss and cache hit,
said first selecting means (19) and said third selecting means (19) being controlled to operate simultaneously at the time of said cache hit.

19. An operation method of a semiconductor memory device with a built-in cache memory, said semiconductor memory device comprising a memory cell array (1) having a plurality of memory cells (MC) arranged to have a plurality of rows and a plurality of columns, said memory cell array being divided into a plurality of blocks (B1 to B16); and a plurality of sense amplifier means (14a) associated with said plurality of columns in said each block for amplifying and holding the information read out from a corresponding column,
said method comprising the steps of:
receiving, in a time-sharing manner or simultaneously, a row address signal (RA) and a column address signal (CA) applied externally at time of a first operation mode while simultaneously receiving block selecting signals (B0, B1) and a column address signal (CA) applied externally at a time of a second operation mode;
selecting any of said plurality of blocks (B1 to B16) in response to a part of said row address signals (RA8, RA9) at the time of said first operation mode;
selecting any row in said selected block in response to the remaining of said row address signals (RA0 to RA7) at the time of said first operation mode;
selecting any of the plurality of sense amplifier means (14a) in said selected block in response to said column address signal (CA) at the time of said first operation mode;
selecting any of said plurality of blocks (B1 to B16) in response to said block selecting signals (B0, B1), and at the same time, selecting any of the plurality of sense amplifier means (14a) in said selected block in response to said column address signal (CA) at the time of said second operation mode.

20. An operation method of a cache memory system using a semiconductor memory device with a built-in cache memory, said semiconductor memory device comprising a memory cell array (1) having a plurality of memory cells (MC) arranged to have a plurality of rows and a plurality of columns,
said memory cell array (1) being divided into a plurality of blocks (B1 to B16); and a plurality of sense amplifier means (14a) associated with said plurality of columns in said each block for amplifying and holding the information read out from said selected row,
said method comprising the steps of:
deciding when a cache hit and a cache miss occurs;
generating a row address signal (RA) and a column address signal (CA) at a time of a cache miss while generating block selecting signal (B0, B1) and a column address signal (CA) at a time of a cache hit;
receiving, in a time-sharing manner or simultaneously, said row address signal (RA) and a column address signal (CA) at the time of a cache miss;
selecting any of said plurality of blocks (B1 to B16) in response to a part of said row address signals (RA8, RA9) at the time of a cache miss;
selecting any row in said selected block in response to the remaining of said row address signals (RA0 to RA7) at the time of said cache miss;
selecting any of the plurality of sense amplifier means (14a) in said selected block in response to said column address signal (CA) at the time of a cache miss;
simultaneously receiving said block selecting signals B0, B1) and a column address signal (CA) at the time of a cache hit;
selecting any of said plurality of blocks (B1 to B16) in response to said block selecting signals (B0, B1), and at the same time, selecting any of the plurality of sense amplifier means (14a) in said selected bock in response to said column address signal (CA) at the time of a cache hit.

21. A semiconductor memory device operable in response to an externally applied cache hit/miss signal, comprising:
a memory cell array (1) including a plurality of memory cells arranged in a plurality of rows and columns, said memory cell array comprising a plurality of blocks (B1-B16) of columns, each block being divided into a plurality of sub blocks each comprising a plurality of said columns;

a plurality of sense amplifier circuit means (14a) activatable for providing signals representing data stored in a memory cell in each of said columns;

a plurality of information holding circuit means (16a) for holding information corresponding to the signals provided by said sense amplifier circuit means;

first selecting circuit means (19) for selecting one of said plurality of blocks of columns;

second selecting circuit means (2) for selecting one row in a selected block;

third selecting circuit means (18) for selecting one sub block in a selected block;

control means responsive to said row address signal and said cache miss signal to activate said first, second and third selecting circuit means, said control means further comprising means responsive to the activation of said first, second and third selecting circuit means for connecting sense amplifier circuit means, associated with the columns of the selected sub block, with corresponding information holding circuit means to transfer thereto information represented by the sense amplifier signals; and fourth selecting circuit means (19) for immediately selecting one block to access information held in a corresponding information holding means in response to a column address signal, an externally applied block selecting signal and said cache hit signal.

22. A semiconductor memory device comprising:

a plurality of memory array blocks (B1-B16) each having a plurality of memory cells arranged in a plurality of rows and columns, a plurality of row decoder means (2) each corresponding to a respective one of said memory array blocks, each row decoder receiving row address signals for selecting one of said rows in the corresponding memory array block, a plurality of sense amplifier group means (14) each corresponding to a respective one of said memory array blocks, each sense amplifier group means comprising a plurality of sense amplifiers arranged in respective columns of the corresponding memory array block, a plurality of information holding group means (16) each corresponding to a respective one of said memory array blocks, each information holding group means comprising a plurality of information holding means arranged in respective columns of the corresponding memory array block, a plurality of transfer group means (15) comprising a plurality of transfer means arranged in respective columns and each connected between corresponding sense amplifier group means and corresponding information holding group means and divided into a plurality of sub blocks, and selecting means (18) for selecting and activating one sub bock of said transfer group means in response to a cache miss signal, a portion of said row address signals and a portion of column address signals.

* * * * *